United States Patent
Cho et al.

(10) Patent No.: US 9,349,762 B2
(45) Date of Patent: May 24, 2016

(54) PIXEL ARRAY, IMAGE SENSOR INCLUDING THE SAME, AND METHOD OF COMPENSATING FOR LOCAL DARK CURRENT

(71) Applicant: SAMSUNG ELECTRONICS CO., LTD., Suwon-si (KR)

(72) Inventors: Young Sung Cho, Anyang-si (KR); Dong Jae Lee, Osan-si (KR); Tae Chan Kim, Yongin-si (KR); Tomer Livneh, Tel Aviv (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 12 days.

(21) Appl. No.: 13/940,522

(22) Filed: Jul. 12, 2013

(65) Prior Publication Data

US 2014/0014818 A1    Jan. 16, 2014

(30) Foreign Application Priority Data

Jul. 13, 2012 (KR) .................. 10-2012-0076611

(51) Int. Cl.
| | |
|---|---|
| H01L 27/146 | (2006.01) |
| H04N 5/361 | (2011.01) |
| H04N 9/04 | (2006.01) |
| H04N 5/232 | (2006.01) |
| H04N 5/3745 | (2011.01) |

(52) U.S. Cl.
CPC .... *H01L 27/14601* (2013.01); *H01L 27/14603* (2013.01); *H01L 27/14609* (2013.01); *H04N 5/361* (2013.01); *H01L 27/14623* (2013.01); *H01L 27/14627* (2013.01); *H01L 27/14645* (2013.01); *H04N 5/23212* (2013.01); *H04N 5/3745* (2013.01); *H04N 9/045* (2013.01)

(58) Field of Classification Search
USPC ........................................ 348/245
See application file for complete search history.

(56) References Cited

U.S. PATENT DOCUMENTS

| | | | | |
|---|---|---|---|---|
| 7,567,277 B2* | 7/2009 | Inaba | ............... | H04N 5/3658 |
| | | | | 348/245 |
| 8,610,802 B2* | 12/2013 | Gomi | ............... | 348/245 |
| 8,816,265 B2* | 8/2014 | Goto | ............... | 250/208.1 |
| 2003/0107814 A1* | 6/2003 | Altmann | ............... | 359/619 |
| 2003/0193011 A1* | 10/2003 | Takeda | ............... | 250/208.1 |
| 2004/0046879 A1* | 3/2004 | Ohzu et al. | ............... | 348/243 |
| 2009/0290049 A1 | 11/2009 | Ukita | | |
| 2012/0075478 A1* | 3/2012 | Ahn | ............... | 348/164 |

FOREIGN PATENT DOCUMENTS

| | | | |
|---|---|---|---|
| GB | 2328338 | * | 7/1998 |
| JP | 2007-214932 A | | 8/2007 |
| JP | 2009-027220 A | | 2/2009 |
| JP | 2009-033321 A | | 2/2009 |
| JP | 2010-011161 A | | 1/2010 |
| KR | 10-2009-0092380 A | | 9/2009 |
| WO | WO2011125677 | * | 10/2011 |

* cited by examiner

*Primary Examiner* — Albert Cutler
(74) *Attorney, Agent, or Firm* — Sughrue Mion, PLLC

(57) ABSTRACT

A pixel array for an image sensor is provided. The pixel array includes a dark pixel which is configured to detect a local dark current in an active pixel block. The dark pixel is distinguished from an optical black pixel block which is arranged around the active pixel block and is configured to detect a global dark current. The pixel array is configured to compensate for dark shading, which is not compensated through global dark current compensation, using the local dark current output from the dark pixel which is arranged within the active pixel block.

24 Claims, 30 Drawing Sheets

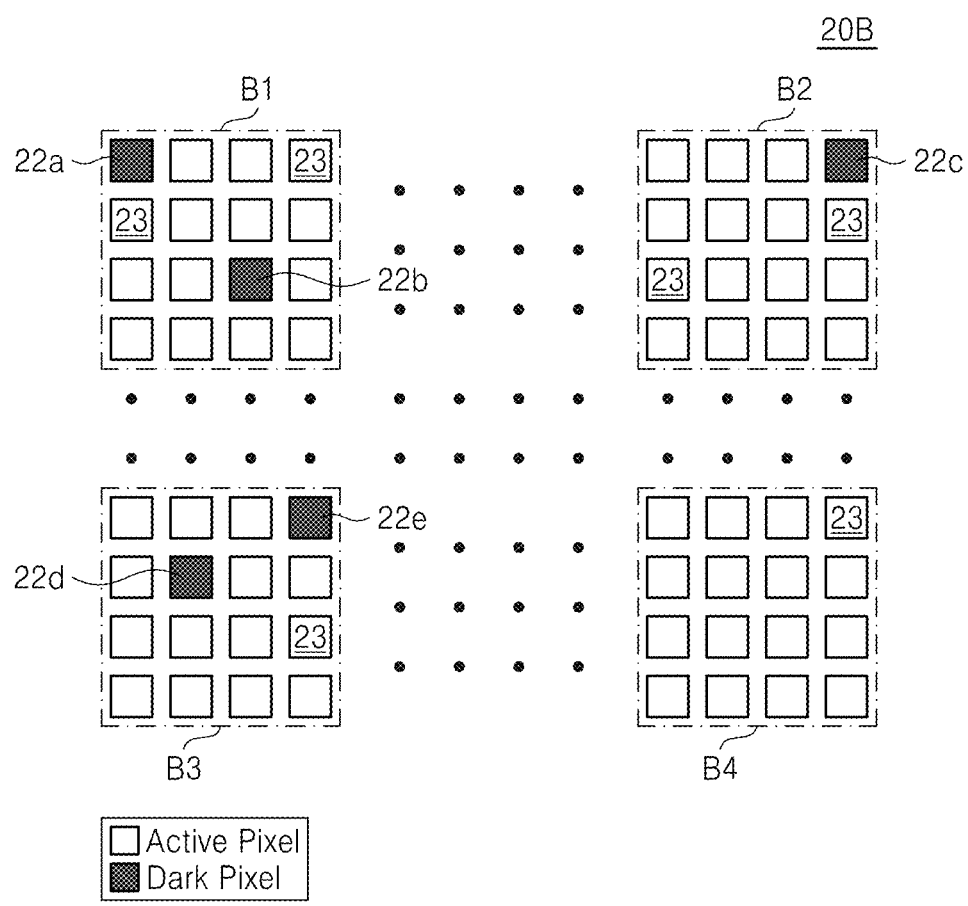

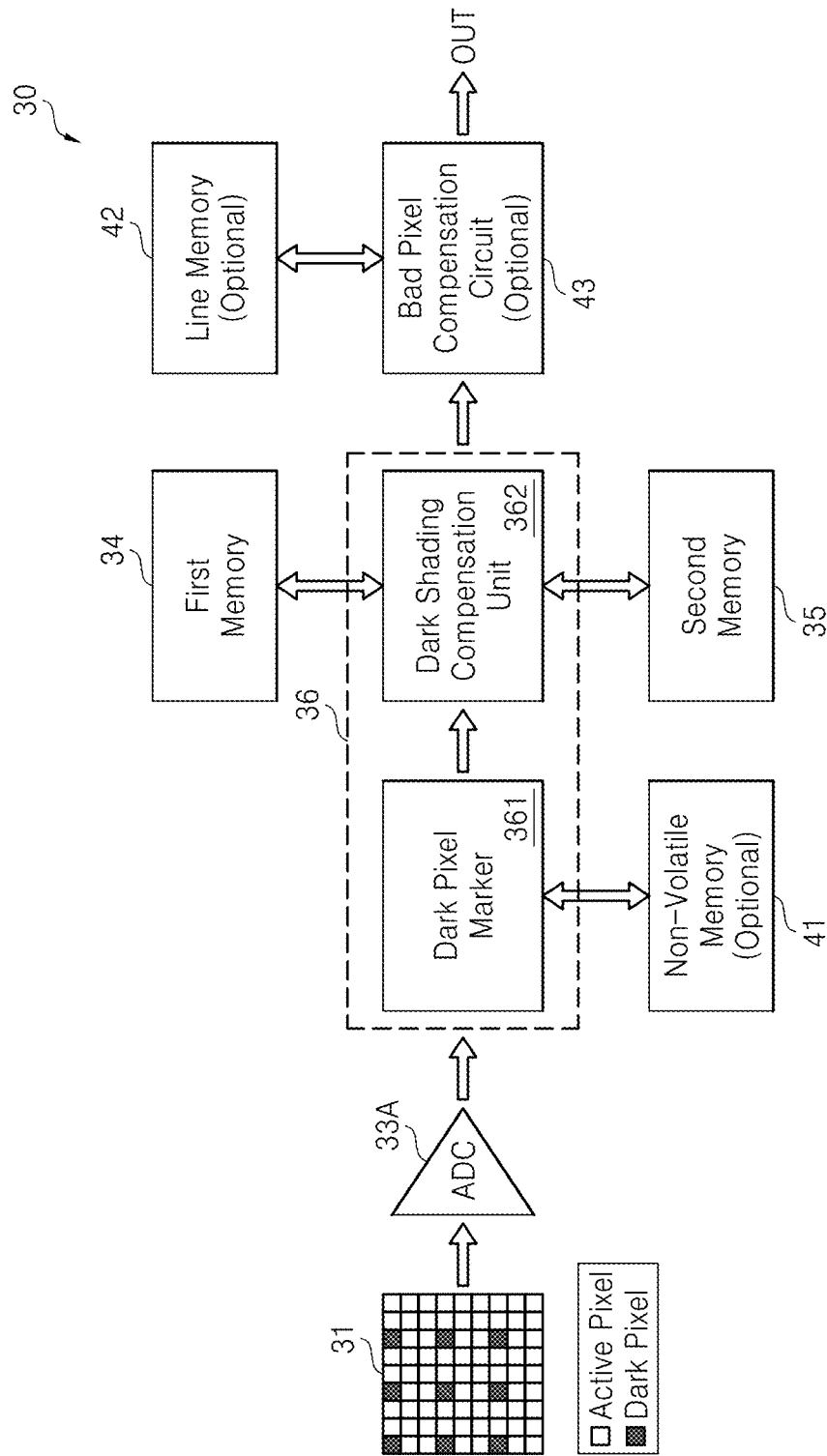

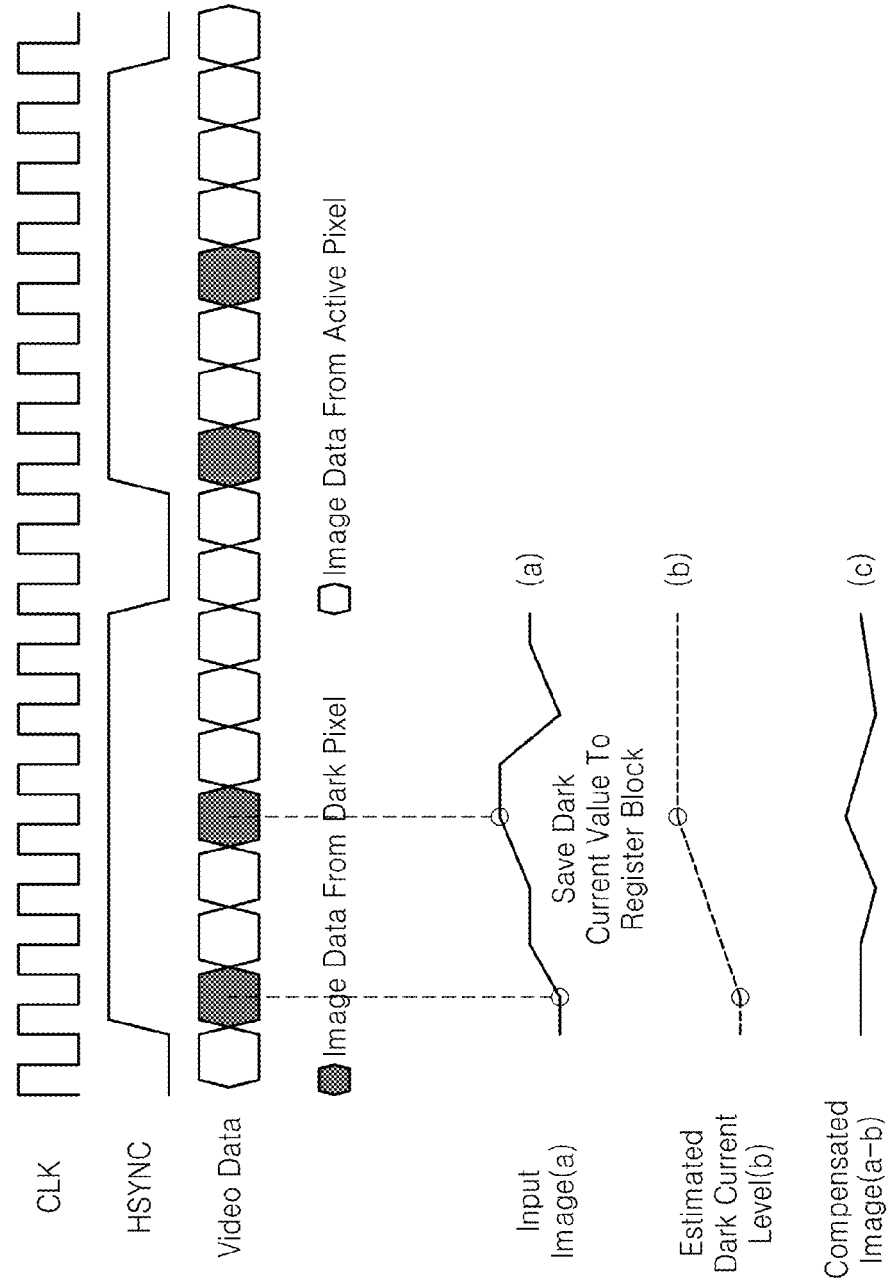

A single cell is fully covered cell

Cover "strips" of $^1/_2$-1-$^1/_2$ cells

Cover "neighborhood"

PIXEL ARRAY, IMAGE SENSOR INCLUDING THE SAME, AND METHOD OF COMPENSATING FOR LOCAL DARK CURRENT

CROSS-REFERENCE TO RELATED APPLICATIONS

This application claims priority from Korean Patent Application No. 10-2012-0076611 filed on Jul. 13, 2012, the disclosure of which is hereby incorporated by reference in its entirety.

BACKGROUND

Exemplary embodiments relate to an image sensor. In particularly, exemplary embodiments relate to a complementary metal oxide semiconductor (CMOS) image sensor for compensating dark shading, i.e., a difference in dark current locally occurring within a pixel array, by including a dark pixel for detecting a local dark current in an active pixel block and a method thereof.

A sensor including a pixel array, which senses effective physical quantities, such as light intensity, temperature, mass, or time, and outputs an electrical signal based on the sensing result, is used in various fields. In particular, an image sensor measuring a captured image of an object is applied to various fields.

In a related art, a dark frame is captured before or after capturing an exposed frame. Then, in the related art, the dark frame is subtracted from the exposed frame. However, in the related art, this requires a mechanical shutter and an image buffer, and measures a dark signal at a different time from a real image.

In a related art, a dark signal is evaluated in an image using a model (such as incorporating information from covered pixels placed at sensor peripherals). However, in the relate art, a dark signal isn't uniform over a pixel array. Therefore, measuring the dark signal at peripherals of the pixel array isn't enough. Even if a model is setup that will accurately approximate the dark signal all over the pixel array but this involves calibration for each sample, which is an expensive process (i.e., the dark signal becomes significant at high ambient temperatures).

In a related art, a complicated mechanical setup (e.g., mirrors and dedicated sensors) are required. However, in the related art, complicated mechanical setups are expensive and inappropriate for small cameras (DSC and mobile), due to a size limitation.

In a related art, partially shielded pixels in a pixel array are incorporated. However, in the related art, partially shielded pixels don't support a measurement of a dark signal.

SUMMARY

According an aspect of an exemplary embodiment, there is provided a pixel array including an active pixel block which includes a plurality of active pixels configured to output an electrical signal corresponding to an optical signal, and at least one dark pixel configured to generate a local dark current and an optical black pixel block which is arranged around the active pixel block and is configured to generate a global dark current.

The active pixel block may include a plurality of unit pixel blocks that have a same pixel arrangement, and each of the unit pixel blocks may include at least one of the active pixels and the at least one dark pixel. Alternatively, the active pixel block may include a plurality of unit pixel blocks that have different pixel arrangements, and each of the unit pixel blocks may include at least two of the active pixels and the at least one dark pixel.

The at least one dark pixel may be randomly placed among the active pixels. The at least one dark pixel may include a light blocking layer formed between a photodiode and a microlens. Alternatively, the at least one dark pixel may include a light blocking layer formed on a microlens.

The at least one dark pixel may not include a photodiode. The at least one dark pixel may not perform photoelectric conversion in response to the optical signal, when generating the local dark current. The at least one dark pixel may not output the electrical signal in response to the optical signal, when generating the local dark current.

According an aspect of another exemplary embodiment, there is provided an image sensor which includes a pixel array including an active pixel block, which includes a plurality of active pixels configured to output an electrical signal corresponding to an optical signal and at least one dark pixel configured to generate a local dark current, and an optical black pixel block which is arranged around the active pixel block and is configured to generate a global dark current; and a compensation circuit which is configured to compensate for the local dark current in each of the active pixels using the local dark current provided from the at least one dark pixel.

The compensation circuit may include a dark pixel marker which is configured to provide position information of the at least one dark pixel from an image signal including the electrical signal output from each of the active pixels and the local dark current output from the at least one dark pixel and a dark shading compensation unit which is configured to compensate for the local dark current in each of the active pixels using the local dark current output from the at least one dark pixel and the position information of the dark pixel.

The image sensor may further include a bad pixel compensation circuit which is configured to perform bad pixel compensation on an output of each of the active pixels in which the local dark current has been compensated.

According an aspect of another exemplary embodiment, there is provided a method of compensating for a local dark current in an image sensor. The method includes generating an electrical signal corresponding to an optical signal using each of a plurality of active pixels included in an active block, and simultaneously generating the local dark current using at least one dark pixel included in the active pixel block; and compensating for the local dark current in each of the active pixels using the local dark current provided from the at least one dark pixel.

The compensating for the local dark current may include providing position information of the at least one dark pixel from an image signal including the electrical signal output from each of the active pixels and the local dark current output from the at least one dark pixel; and compensating for the local dark current in each of the active pixels using the local dark current output from the at least one dark pixel and the position information of the at least one dark pixel.

According an aspect of another exemplary embodiment, there is provided a method of compensating for a local dark current in an image sensor. The method includes reading pixel data from an active pixel block which includes at least one active pixel and at least one dark pixel; estimating the local dark current of the at least one active pixel using a calculated value for a position of the at least one dark pixel or an address of the at least one dark pixel; performing compensation of the local dark current on the at least one active pixel using the estimated local dark current when the local dark current exists; and outputting the compensated pixel data.

BRIEF DESCRIPTION OF THE DRAWINGS

FIGS. 2A through 2C are diagrams of the arrangement of pixels including a dark pixel in an active pixel block illustrated in FIG. 1 according to some embodiments of the exemplary embodiments;

FIGS. 4A through 4C are diagrams illustrating a circuit including a compensation circuit illustrated in FIG. 3, and the operations of the circuit;

DETAILED DESCRIPTION OF THE EXEMPLARY EMBODIMENTS

Figure 1:
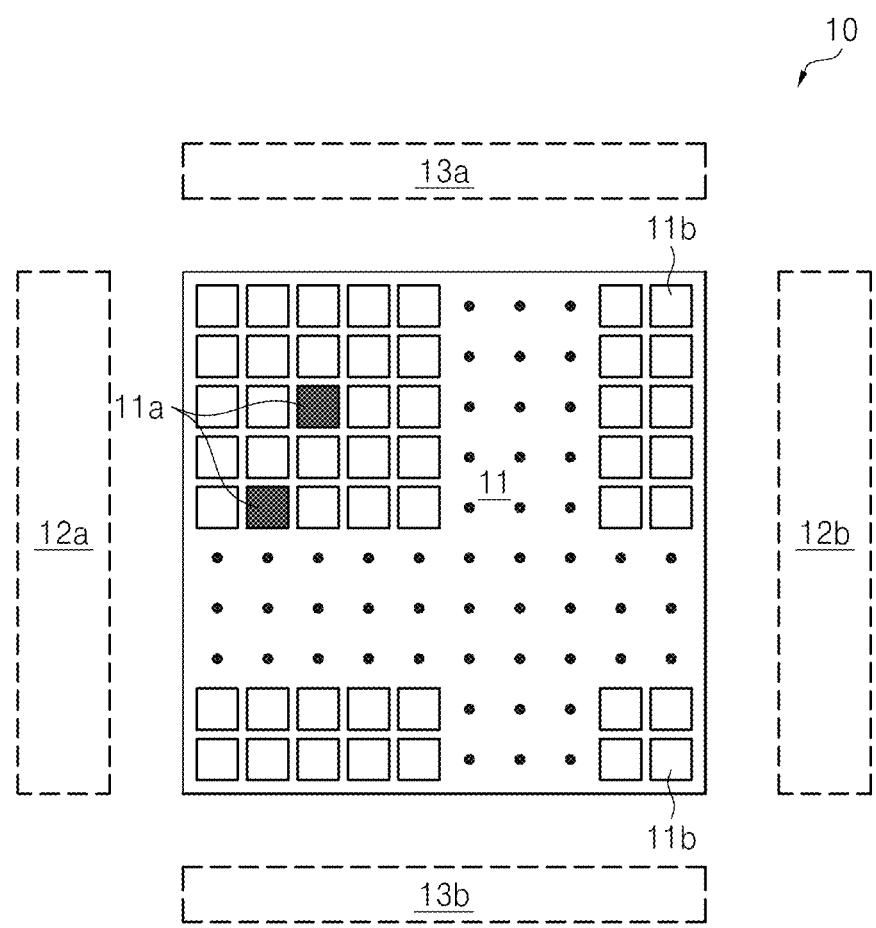
FIG. 1 is a diagram of a pixel array included in an image sensor according to some embodiments of the exemplary embodiments.

FIG. 1 is a diagram of a pixel array 10, included in an image sensor according to some embodiments of the exemplary embodiments. The pixel array 10 includes an active pixel block 11, column optical black (OB) pixel blocks 12a and 12b, and frame OB pixel blocks 13a and 13b.

The active pixel block 11 includes at least one dark pixel 11a, which detects or extracts a local dark current and a plurality of active pixels 11b, which output image data. The at least one dark pixel 11a is positioned within the active pixel block 11, and is used to detect a local dark current generated within the active pixel block 11.

The column OB pixel blocks 12a and 12b are positioned on the left and right sides, respectively, of the active pixel block 11, and are used to detect a global dark current existing between columns. The frame OB pixel blocks 13a and 13b are used to detect a global dark current existing between frames. In other words, the column OB pixel blocks 12a and 12b and the frame OB pixel blocks 13a and 13b detect a global dark current, i.e., a dark current distributed throughout the active pixel block 11.

OB pixels implemented in the column OB pixel blocks 12a and 12b and the frame OB pixel blocks 13a and 13b have substantially the same structure as the active pixels 11b in the active pixel block 11, except for a structure for blocking out incident light. The structure for blocking out the incident light may be implemented by a material, such as metal. With such structure, the OB pixels in the blocks 12a, 12b, 13a and 13b do not perform photoelectric conversion.

Accordingly, the image sensor can adjust the level of a global dark current in the active pixel block 11, using the level of a global dark current sensed or detected by the OB pixels in the blocks 12a, 12b, 13a and 13b. The adjustment includes a compensation process in which the level of a voltage detected in the active pixel block 11 is increased or decreased as a whole, using the level of the detected global dark current.

The at least one dark pixel 11a positioned within the active pixel block 11 may detect a local dark current that may show a locally different property, within the active pixel block 11 in which the active pixels 11b are disposed.

Figure 2A:
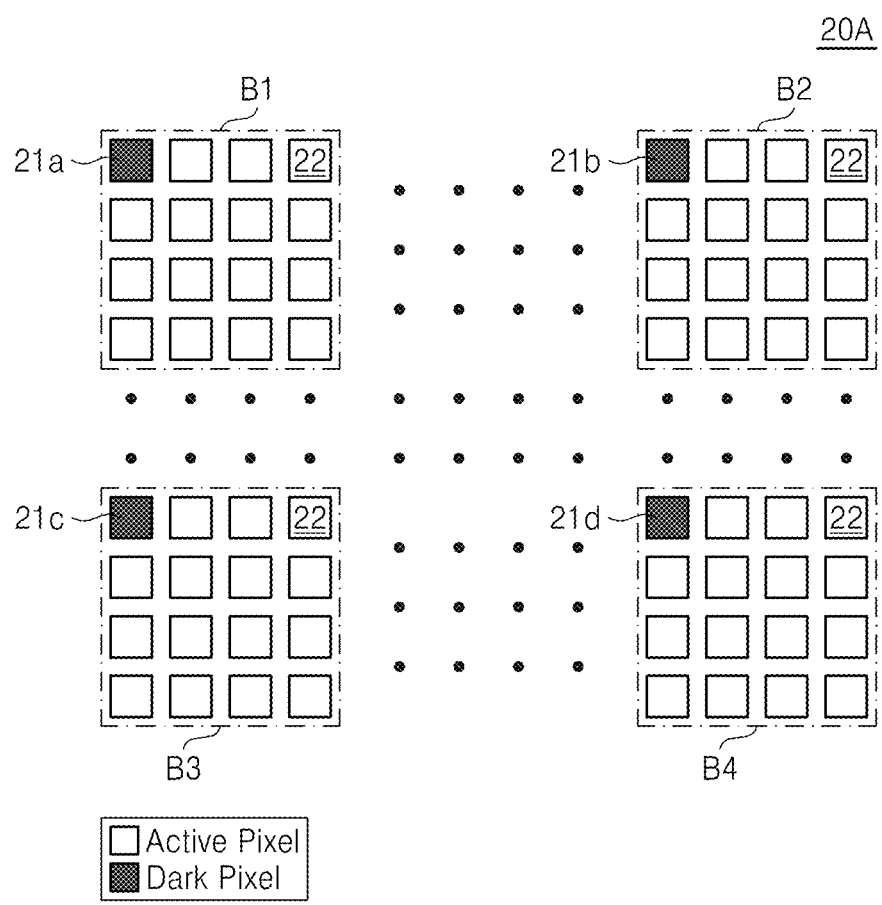
Figure 2C:
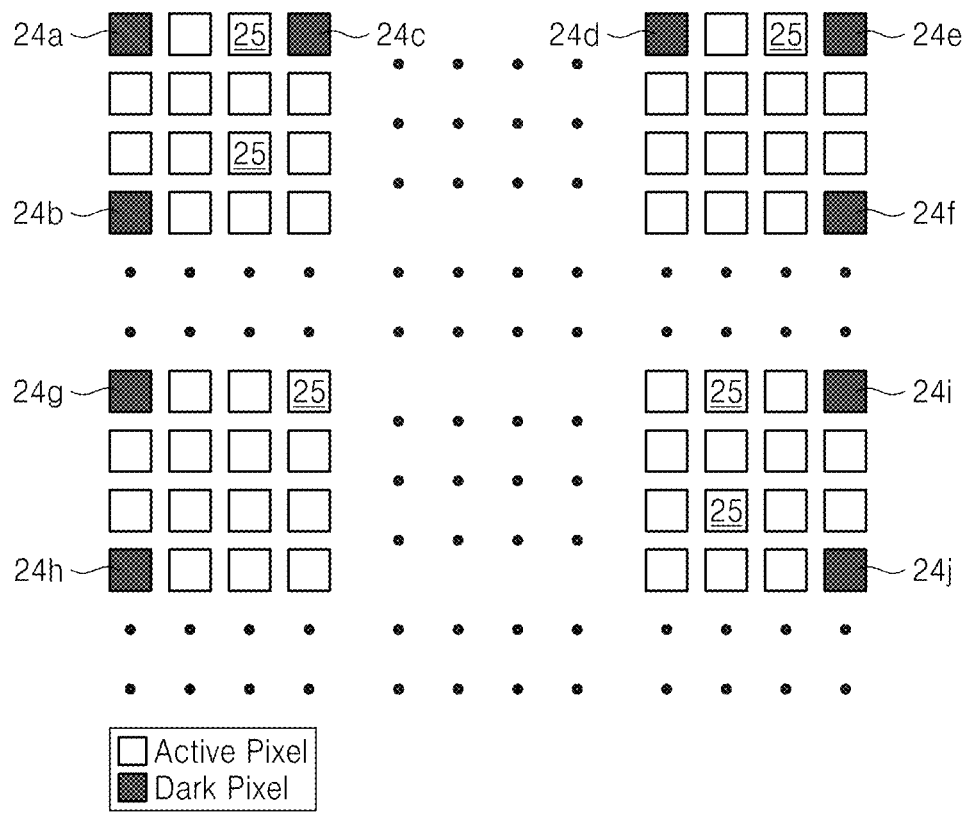

FIGS. 2A through 2C are diagrams of the arrangement of pixels, including a dark pixel in the active pixel block 11 illustrated in FIG. 1, according to some embodiments of the exemplary embodiments.

Figure 11:
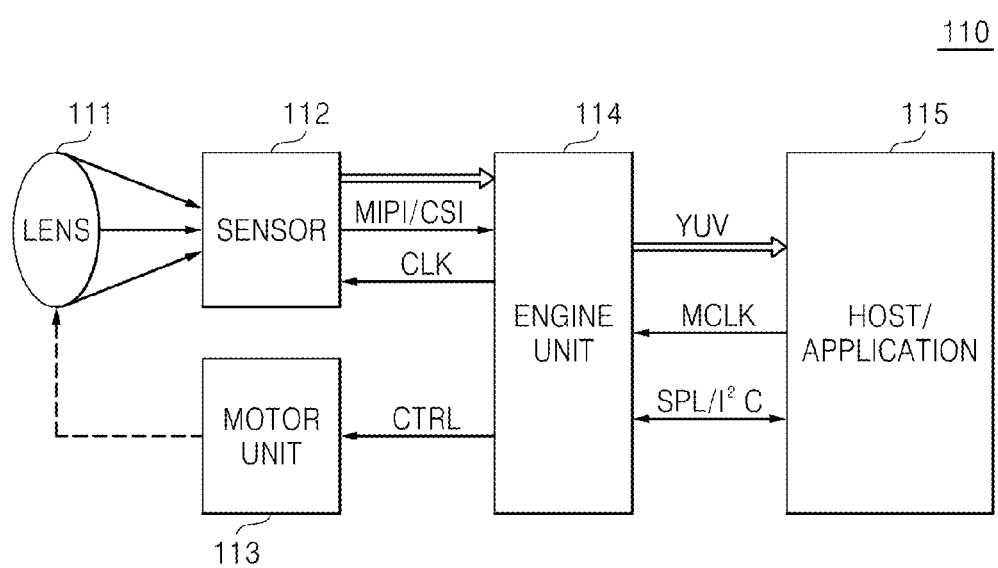
FIG. 11 is a block diagram of a camera system according to some embodiments of the exemplary embodiments.

Referring to FIG. 2A, an active pixel block 20A, corresponding to the active pixel block 11 illustrated in FIG. 11 according to an embodiment of the exemplary embodiments, includes a plurality of unit pixel blocks B1 through B4. The unit pixel blocks B1 through B4 have the same pixel arrangement. Each of the unit pixel blocks B1 through B4 include a plurality of active pixels 22 and a single dark pixel 21a, 21b, 21c or 21d, in the same pixel arrangement.

Although only one dark pixel 21a, 21b, 21c or 21d is included in each of the unit pixel blocks B1 through B4, the number of dark pixels included in each of the unit pixel blocks B1 through B4 may be changed.

When the number of the active pixels 22 increases in each of the unit pixel blocks B1 through B4, the number of the dark pixels 21a through 21d in the active pixel block 20A decreases. Therefore, the number of dark pixels to be interpolated decreases. Further, when the number of the active pixels 22 decreases in each of the unit pixel blocks B1 through B4, the number of the dark pixels 21a through 21d in the active pixel block 20A increases. Therefore the number of dark pixels to be interpolated increases. The increase in the number of pixels to be interpolated, i.e., the increase in the number of the dark pixels 21a through 21d has a negative effect of reducing color reproducibility, but has a positive effect of enabling local dark current compensation to be carried out more precisely.

Referring to FIG. 2B, an active pixel block 20B, corresponding to the active pixel block 11 illustrated in FIG. 11 according to another embodiment of the exemplary embodiment, includes a plurality of the unit pixel blocks B1 through B4. The unit pixel blocks B1 through B4 have different pixel arrangements. In other words, the unit pixel blocks B1 through B4 include different numbers of active pixels 23, and different numbers of dark pixels. For instance, each of the first and third unit pixel blocks B1 and B3 includes fourteen active pixels 23 and two dark pixels 22a and 22b or 22d and 22e. The second unit pixel block B2 includes fifteen active pixels 23 and one dark pixel 22c. The fourth unit pixel block B4 includes only sixteen active pixels 23.

Referring to FIG. 2C, an active pixel block 20C, corresponding to the active pixel block 11 illustrated in FIG. 11 according to another embodiment of the exemplary embodiments, includes a plurality of active pixels 25 and a plurality of dark pixels 24a through 24j. The dark pixels 24a through 24j may be concentrated on a particular position in the active pixel block 20C. For instance, the particular position may be the edge of the active pixel block 20C. The dark pixels 24a through 24j may be concentrated on a portion, such as the edge or the center, of the active pixel block 20C, where a local dark current fluctuates.

Figure 3:
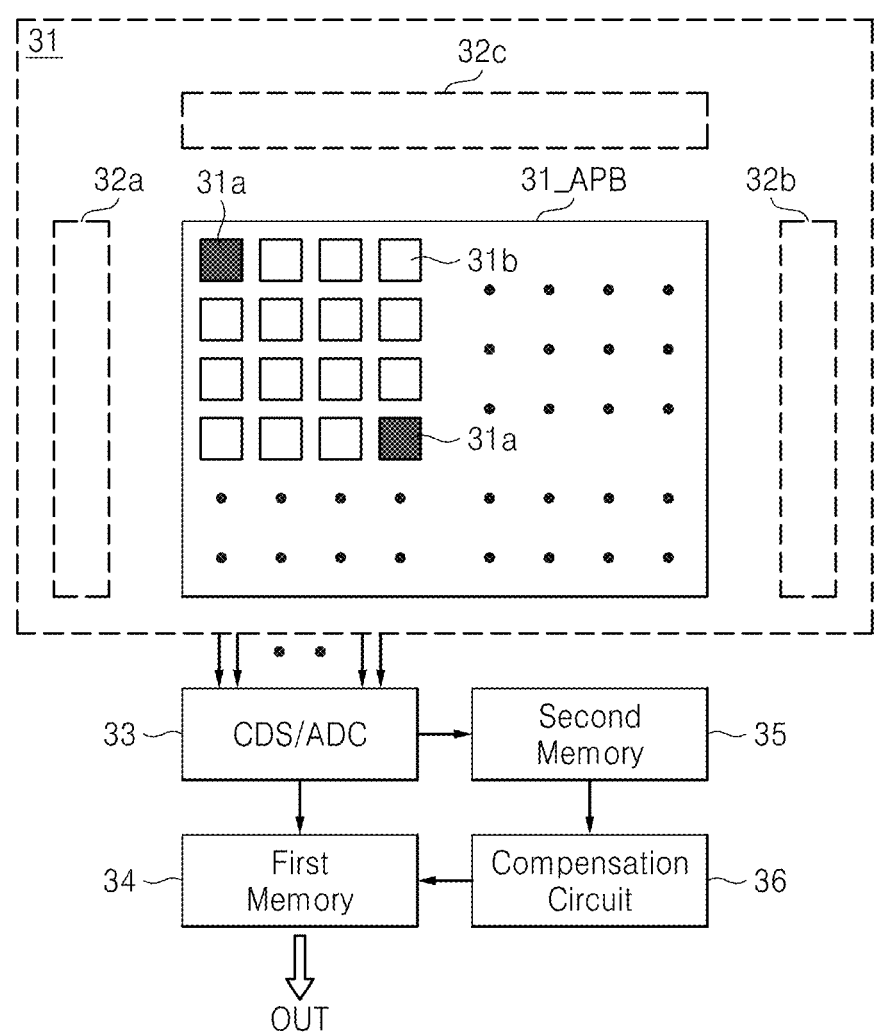
FIG. 3 is a block diagram of an image sensor according to some embodiments of the exemplary embodiments.

FIG. 3 is a block diagram of an image sensor 30 according to some embodiments of the exemplary embodiments. Referring to FIG. 3, the image sensor 30 includes a pixel array 31 including the active pixel blocks 11, 20A, 20B, or 20C illustrated in FIGS. 1 through 2C, a correlated double sampling/analog-to-digital converter (CDS/ADC) 33, a first memory 34, a second memory 35, and a compensation circuit 36. The image sensor 30 may be any type of image sensor, such as a complementary metal oxide semiconductor (CMOS) image sensor or a charge coupled device (CCD) image sensor, which has the structure of the pixel array 31.

The pixel array 31 includes a plurality of dark pixels 31a and a plurality of active pixels 31b. The active pixels 31b may include at least one pixel among pixels for sensing primary colors, e.g., red (R), green (G), and blue (B), pixels for sensing complementary colors, e.g., magenta (Mg), cyan (Cy), and yellow (Y), and a pixel for sensing white.

The dark pixels 31a are positioned near the active pixels 31b, within an active pixel block 31_APB. The dark pixels 31a output charge generated in dark, i.e., dark current corresponding to the charge, instead of photocharge generated from light.

Column OB pixel blocks 32a and 32b and a frame OB pixel block 32c sense and output dark current like the dark pixels 31a, but the blocks 32a through 32c are provided for global dark current compensation throughout the pixel array 31, and cannot carry out compensation for local dark current. However, according to the current embodiments of the exemplary embodiments, the dark pixels 31a can carry out compensation for locally occurring dark current, i.e., local dark current.

The CDS/ADC 33 may perform CDS, and analog-to-digital conversion separately or simultaneously. The CDS may be performed according to an analog mode, a digital mode, or a dual CDS mode. The ADC may be implemented by a group of column ADCs respectively provided for columns in the pixel array 31, or a single ADC.

The first memory 34 receives and stores a digital image signal from the CDS/ADC 33. The pixel array 31 outputs data in units of frames. Therefore, the first memory 34 may be implemented as a frame memory.

The second memory 35 stores output signals of the dark pixels 31a, i.e., local dark current levels (or information corresponding to the local dark current levels) output from the CDS/ADC 33. A dark current level may be expressed as a digital value corresponding to the level of dark current. The second memory 35 may be implemented by a register. The second memory 35 may be included in the first memory 34, so that a single memory may be implemented. Implementing the single memory is possible because the positions and the addresses of the dark pixels 31a are fixed. Therefore, data corresponding to an address fixed in a single memory can be considered a local dark current level.

The compensation circuit 36 performs local dark current compensation with respect to the active pixels 31b in the active pixel block 31_APB, using the local dark current levels stored in the second memory 35. For instance, the second memory 35 may store a local dark current level designated for an active pixel 31b to be subjected to local dark current compensation. Accordingly, the local dark current compensation is performed by subtracting the local dark current level from the active pixel 31b.

This operation may be performed by updating the data of the active pixel 31b stored in the first memory 34. In other words, an initial active pixel value before the local dark current compensation is replaced with a compensated value in the first memory 34.

Digital image data OUT stored in the first memory 34 may be provided to a digital image signal processor (not shown).

Figure 4B:
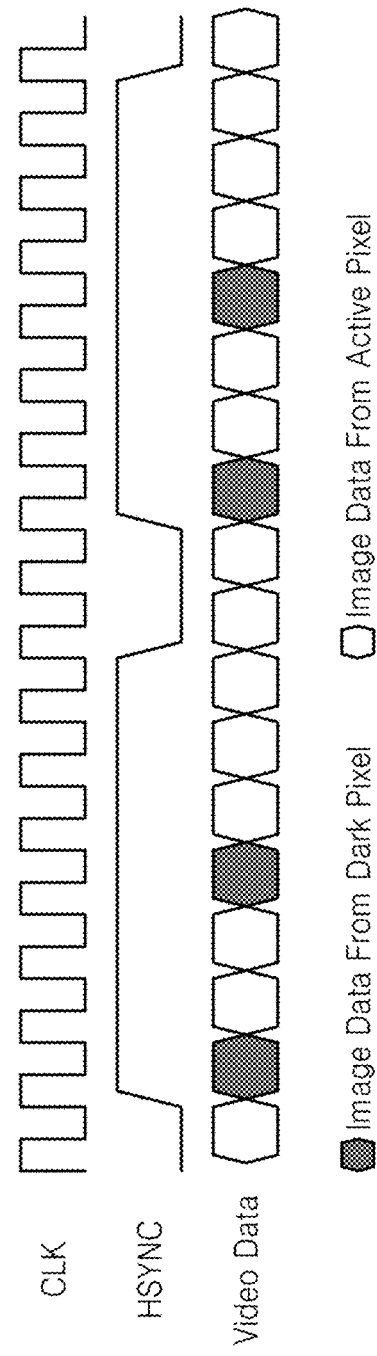

FIGS. 4A through 4C are diagrams illustrating related circuits including the compensation circuit 36 illustrated in FIG. 3, and the operations of the circuits. Referring to FIG. 4A, the image sensor 30 includes the pixel array 31, an ADC 33A, the compensation circuit 36, the first memory 34, the second memory 35, an auxiliary non-volatile memory 41, a bad pixel compensation circuit 43, and an auxiliary line memory 42.

The compensation circuit 36 includes a dark pixel marker 361 and a dark shading compensation unit 362. Dark shading indicates that dark current is different throughout the pixel array 31, due to the positions of the dark pixels 31a and other factors that may include temperature and/or exposure time.

The dark pixel marker 361 marks addresses of the respective dark pixels 31a from pixel data, and transmits the marked addresses to the dark shading compensation unit 362. The dark shading compensation unit 362 performs local dark current compensation, i.e., dark shading compensation with respect to the active pixels 31b using local dark currents obtained by the dark pixels 31a based on the marked addresses. As described above, the dark shading compensation is carried out by subtracting a local dark current value from an active pixel value.

The ADC 33A corresponds to the CDS/ADC 33 illustrated in FIG. 3, and is provided to simplify the description of the CDS/ADC 33.

The first memory 34 is implemented by a line memory. The second memory 35 is implemented by a register, e.g., a dark current register. The auxiliary non-volatile memory 41 may be included or changed according to the usage of the image sensor 30. Information necessary for the operation of the image sensor 30 may be stored in the auxiliary non-volatile memory 41 in advance, or during the operation.

An image signal output from the compensation circuit 36 is compensated by the bad pixel compensation circuit 43. For instance, the bad pixel compensation circuit 43 performs compensation on a real error pixel (i.e., a bad pixel), not a pixel like a dark pixel having an intentional error value. The auxiliary line memory 42 may be additionally provided for bad pixel compensation. The auxiliary line memory 42 may be used to store a value calculated during interpolation, when a pixel value is replaced through the interpolation using values of active pixels around a bad pixel during the bad pixel compensation.

FIG. 4B is a diagram for explaining the operation of the dark pixel marker 361. FIG. 4C is a diagram for explaining the operation of the dark shading compensation unit 362.

Referring to FIGS. 4A through 4C, video data input to the dark pixel marker 361 includes an output (e.g., real image data) of an active pixel and an output (e.g., a local dark current) of a dark pixel. The dark pixel marker 361 determines whether data input is active pixel data or dark pixel data, and provides a determination result to the dark shading compensation unit 362. At this time, a clock signal CLK and a horizontal synchronous signal HSYNC may be used to transmit the video data.

As shown in FIGS. 2A through 2C, when the position of a dark pixel is fixed, the dark pixel marker 361 can find the position of the dark pixel. For instance, the dark pixel marker 361 may store row and column information regarding the dark pixels 21a through 21d in the unit pixel blocks B1 through B4 in FIG. 2A in advance, receive row and column information regarding the position of an active pixel to be subjected to compensation, designate a position of a pixel requiring compensation based on the received row and column information, and provide the designated position to the dark shading compensation unit 362.

As shown in FIG. 2B, when dark pixels are randomly placed, addresses stored in advance in the auxiliary non-volatile memory 41 may be used.

A local dark current level (or value) provided using a dark pixel may be stored in the second memory 35, i.e., a dark current register. The dark shading compensation unit 362 estimates a local dark current for a local dark current compensation region using the local dark current level stored in the second memory 35. The estimation is possible through interpolation. Thereafter, the dark shading compensation unit 362 performs addition or subtraction on output values of active pixels (e.g., pixel values stored in the first memory 34) and dark current levels that have been estimated.

Referring to FIG. 4C and graph (a), data with a local dark current is output from active pixels. As shown in FIG. 4C and graph (b), the dark shading compensation unit 362 estimates or calculates a dark current compensation level (or value) for each active pixel. Thereafter, the dark shading compensation unit 362 subtracts the estimated dark current compensation level (b) from the output data (a), thereby outputting local dark current compensated data, as shown in graph (c).

Figure 5A:
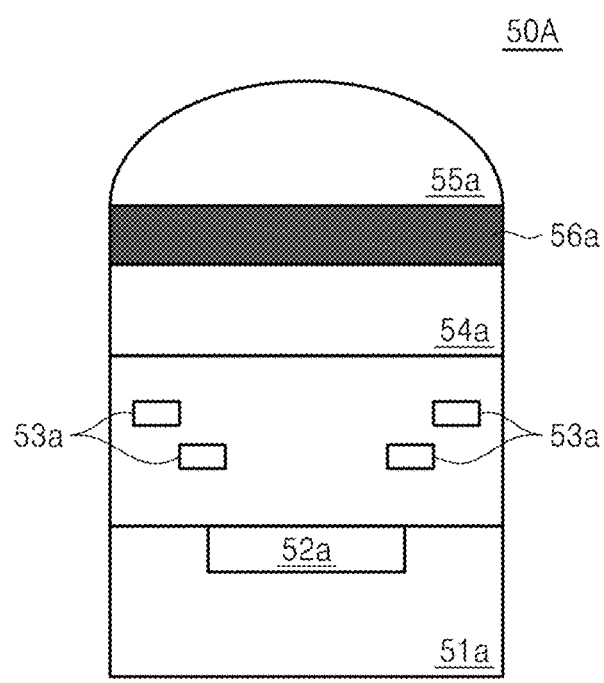
FIGS. 5A through 5F are diagrams of examples of a dark pixel illustrated in FIGS. 1 through 3 according to some embodiments of the exemplary embodiments.

FIGS. 5A through 5F are diagrams of examples of a dark pixel illustrated in FIGS. 1 through 3 according to some embodiments of the exemplary embodiments. FIG. 5A shows a dark pixel 50A used in a front-side illuminated image sensor. Referring to FIG. 5A, a photoelectric conversion element 52a is placed in a substrate 51a. The photoelectric conversion element 52a may be implemented by a photodiode, a pinned photodiode, or a photo transistor. Metal lines 53a are placed above the photoelectric conversion element 52a.

An inter-layer including a plurality of insulating films may be placed among the metal lines 53a. The inter-layer may have a variety of structures to secure an optical path. A color filter 54a is placed on a region in which the metal lines 53a are implemented. A plurality of inter-layers may be placed below and above the color filter 54a for planarization. A micro lens 55a is placed on the color filter 54a.

A light blocking layer 56a is placed between the micro lens 55a and the color filter 54a. The light blocking layer 56a blocks light incident through the micro lens 55a to prevent the light from being transmitted below to the photoelectric conversion element 52a.

Since the dark pixel 50A is used to detect a dark current, visible light and light in other ranges needs to be blocked. For this purpose, the light blocking layer 56a may be formed using a material that blocks all ranges of wavelengths. For instance, the light blocking layer 56a may be formed using a metal.

The light blocking layer 56a may be a part of the color filter 54a, or may be the color filter 54a itself. In this case, reference numeral 54a may denote a planarization layer below a color filter, and reference numeral 56a may denote a light blocking layer formed during a process of forming a color filter for an active pixel.

Since incident light is blocked by the light blocking layer 56a, the dark pixel 50A placed together with active pixels in an active pixel block can be used to detect a local dark current level.

Figure 5B:
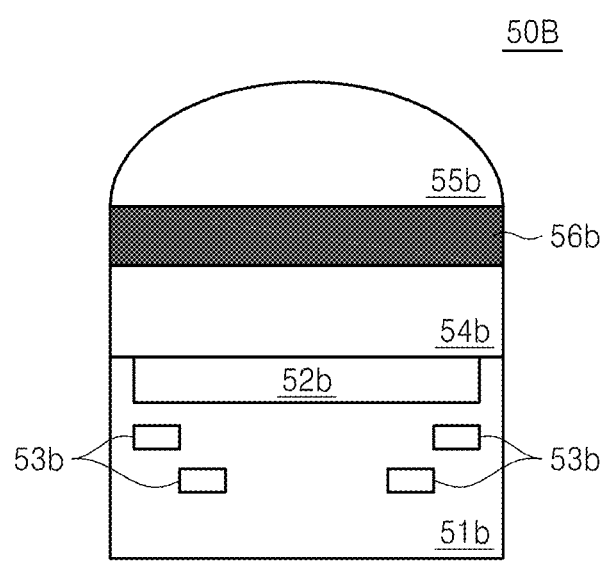

FIG. 5B shows a dark pixel 50A used in a back-side illuminated image sensor. Referring to FIG. 5B, metal lines 53b are placed in a substrate 51b. A photoelectric conversion element 52b is placed on or above the metal lines 53b. A color filter 54b is placed on the photoelectric conversion element 52b. A micro lens 55b is placed on the color filter 54b.

A light blocking layer 56b is placed between the micro lens 55b and the color filter 54b. Since incident light is blocked by the light blocking layer 56b, the dark pixel 50B placed together with active pixels in an active pixel block can be used to detect a local dark current level.

Figure 5C:
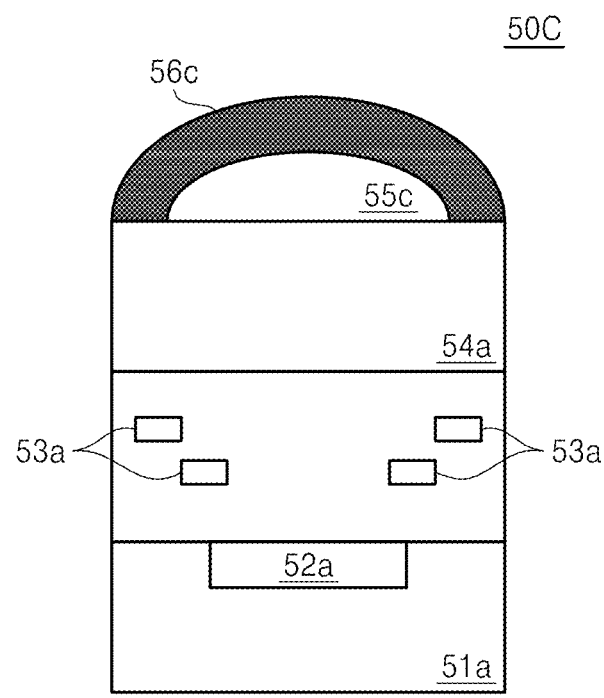

Similar to the dark pixel 50A illustrated in FIG. 5A, a dark pixel 50C illustrated in FIG. 5C may be used in a front-side illuminated image sensor. A light blocking layer 56c is placed on a micro lens 55c. The light blocking layer 56c may be a part of the micro lens 55c.

Figure 5D:
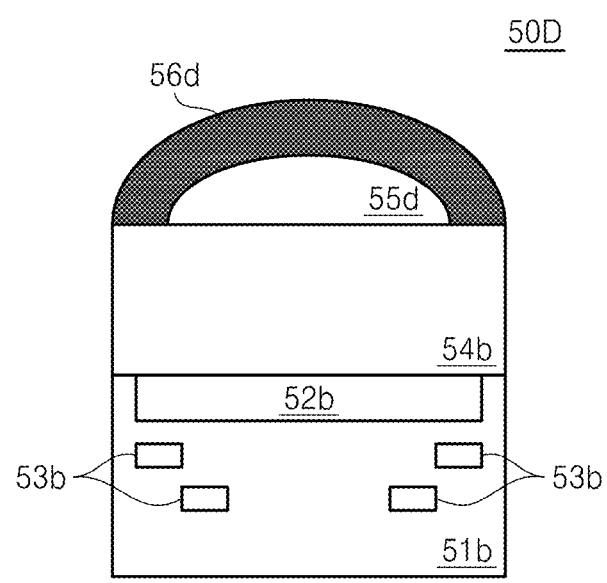

Similar to the dark pixel 50B illustrated in FIG. 5B, a dark pixel 50D illustrated in FIG. 5D may be used in a back-side illuminated image sensor. A light blocking layer 56d is placed on a micro lens 55d. The light blocking layer 56d may be part of the micro lens 55d.

Figure 5E:
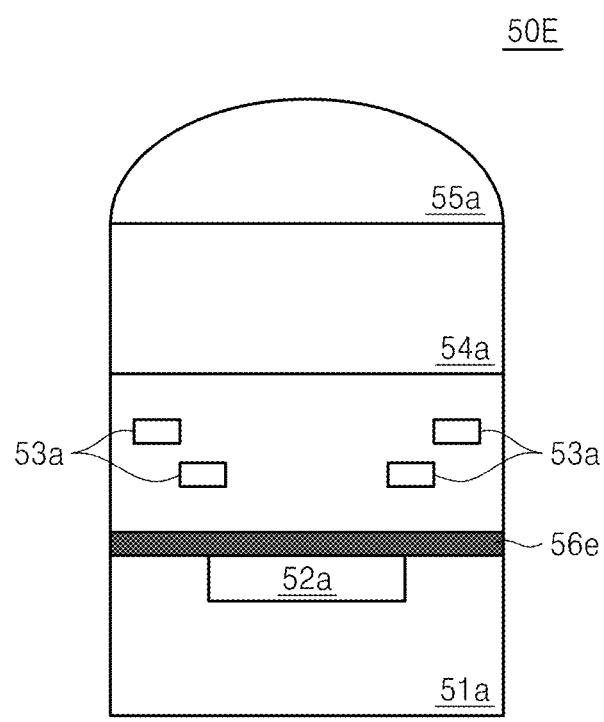

Like the dark pixels 50A and 50C illustrated in FIGS. 5A and 5C, respectively, a dark pixel 50E illustrated in FIG. 5E may be used in a front-side illuminated image sensor. A light blocking layer 56e is placed on the photoelectric conversion element 52a. The light blocking layer 56e may be placed in an inter-layer.

Figure 5F:
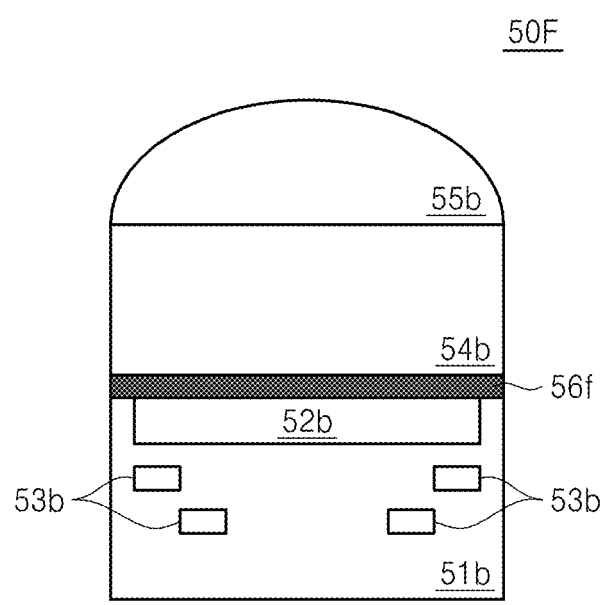

Similar to the dark pixels 50B and 50D illustrated in FIGS. 5B and 5D, respectively, a dark pixel 50F illustrated in FIG. 5F may be used in a back-side illuminated image sensor. A light blocking layer 56f is placed on the photoelectric conversion element 52b.

Each of the dark pixels 50A through 50F illustrated in FIGS. 5A through 5F, respectively, has a structure in which the light blocking layer 56a, 56b, 56c, 56d, 56e, or 56f is added to the structure of an active pixel.

Figure 6A:
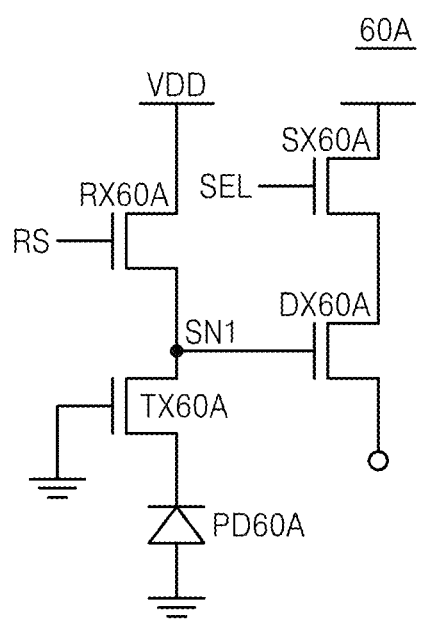
FIGS. 6A through 6C are circuit diagrams of the dark pixel illustrated in FIGS. 1 through 3 according to some embodiments of the exemplary embodiments.
Figure 6B:
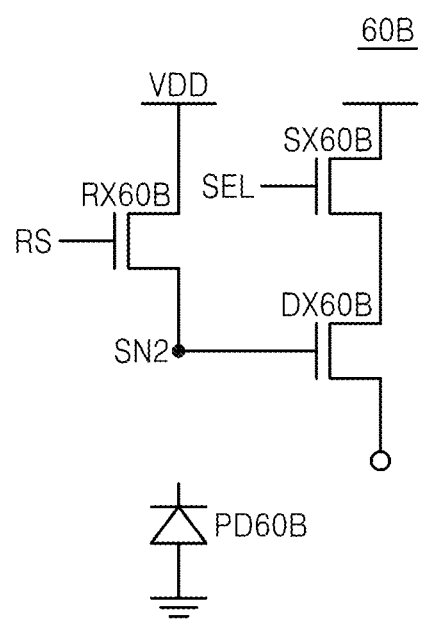
Figure 6C:
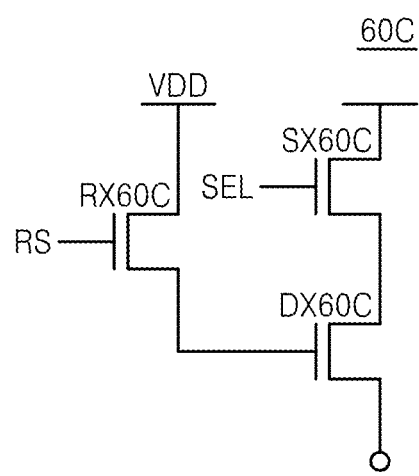

FIGS. 6A through 6C are circuit diagrams of the dark pixel illustrated in FIGS. 1 through 3 according to some embodiments of the exemplary embodiments. A dark pixel included in a CMOS image sensor including a photodiode will be described with reference to FIGS. 6A through 6C.

While there are no changes in the internal elements of each of the dark pixels 50A through 50F in the embodiments illustrated in FIGS. 5A through 5F, there are some changes in the internal elements of dark pixels 60A through 60C in the embodiments illustrated in FIGS. 6A through 6C.

Referring to FIG. 6A, the dark pixel 60A includes a photodiode PD60A, a transfer transistor TX60A, a reset transistor RX60A gated with a reset signal RS, a select transistor SX60A gated with a select signal SEL, and a drive transistor DX60A. The dark pixel 60A includes the same elements TX60A, RX60A, SX60A, DX60A and PD60A as an active pixel structure that includes four transistors and a single photodiode. However, since a gate of the transfer transistor TX60A is connected to a ground node, photocharge generated in the photodiode PD60A is not transferred to a sensing node SN1.

Referring to FIG. 6B, the dark pixel 60B includes a photodiode PD60B, a reset transistor RX60B gated with a reset signal RS, a select transistor SX60B gated with a select signal SEL, and a drive transistor DX60B. The dark pixel 60B includes the elements RX60B, SX60B, DX60B and PD60B, which are similar to elements of an active pixel structure that includes three transistors and a single photodiode without including a transfer transistor. Since the dark pixel 60B does not include a transfer transistor and the photodiode PD60B is separated from a sensing node SN2, photocharge generated in the photodiode PD60B is not transferred to the sensing node SN2.

Referring to FIG. 6C, the dark pixel 60C includes a reset transistor RX60C gated with a reset signal RS, a select transistor SX60C gated with a select signal SEL, and a drive transistor DX60C. The dark pixel 60C includes only three transistors RX60C, SX60C, and DX60C without including a photodiode and a transfer transistor. Since the dark pixel 60C does not include a photodiode and a transfer transistor, local dark current corresponding to charge that can be generated in the photodiode is excluded.

As described above, although the dark pixels 50A through 50F in the embodiments illustrated in FIGS. 5A through 5F have the same structure as an active pixel, the dark pixels 50A through 50F block incident light from being transmitted to a photoelectric conversion element, such as a photodiode. Accordingly, compensation of dark current flowing into the photodiode 52a or 52b and a sensing node is possible.

However, the dark pixels 60A through 60C do not include a photodiode or block the flow of charge from the photodiode to the sensing node SN1 or SN2, even if they include a photodiode in the embodiments illustrated in FIGS. 6A through 6C. Therefore, compensation of dark current only flowing into the sensing node SN1 or SN2 is mainly carried out.

FIGS. 7A through 7D are circuit diagrams of a pixel illustrated in FIGS. 1 through 3 according to some embodiments of the exemplary embodiments. Diverse pixels that will be described below may be applied to both an active pixel and a dark pixel.

Figure 7A:
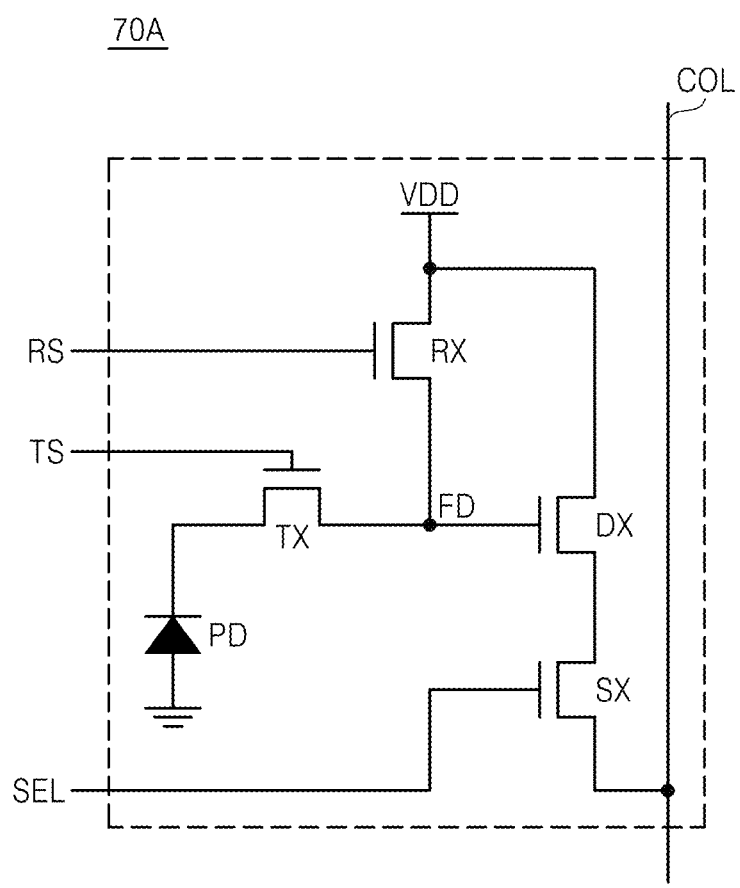
FIGS. 7A through 7D are circuit diagrams of a pixel illustrated in FIGS. 1 through 3 according to some embodiments of the exemplary embodiments.

Referring to FIG. 7A, a pixel 70A includes a photodiode PD, a transfer transistor TX, a floating diffusion node FD, a reset transistor RX, a drive transistor DX, and a select transistor SX. The transfer transistor TX operates in response to a transfer control signal TS. The reset transistor RX operates in response to a reset control signal RS. The select transistor SX operates in response to a select signal SEL. The photodiode PD may be implemented by at least one among a photo transistor, a photo gate, a pinned photodiode, and a combination thereof.

FIG. 7A shows a 4-transistor (4T) structure that includes one photodiode PD and four MOS transistors TX, RX, DX, and SX. However, the embodiments are not restricted to this example. Any circuits including at least three transistors including the drive transistor DX and the select transistor SX and the photodiode PD may be used in the embodiments of the exemplary embodiments.

Figure 7B:
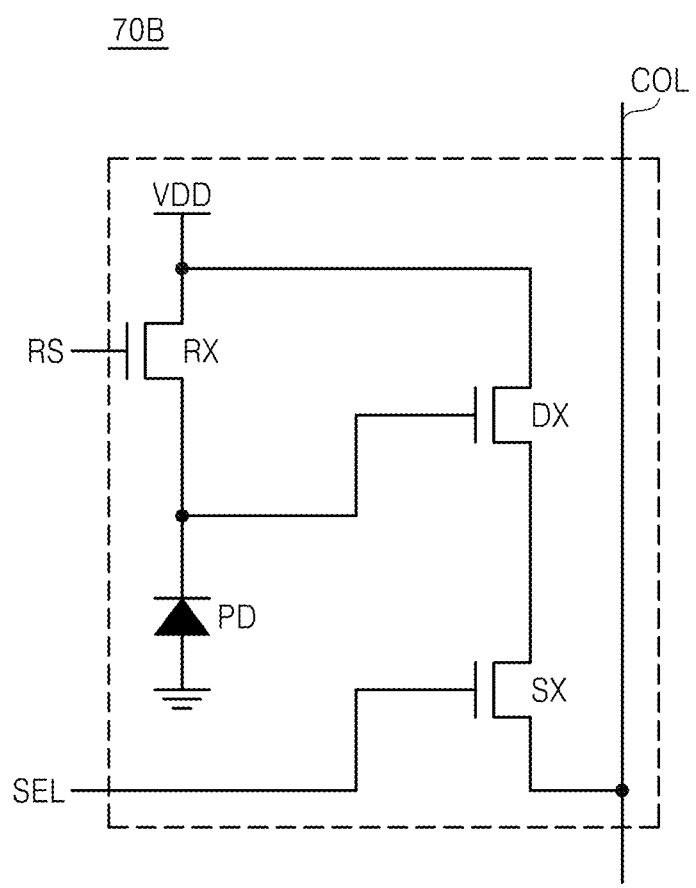
Figure 7C:
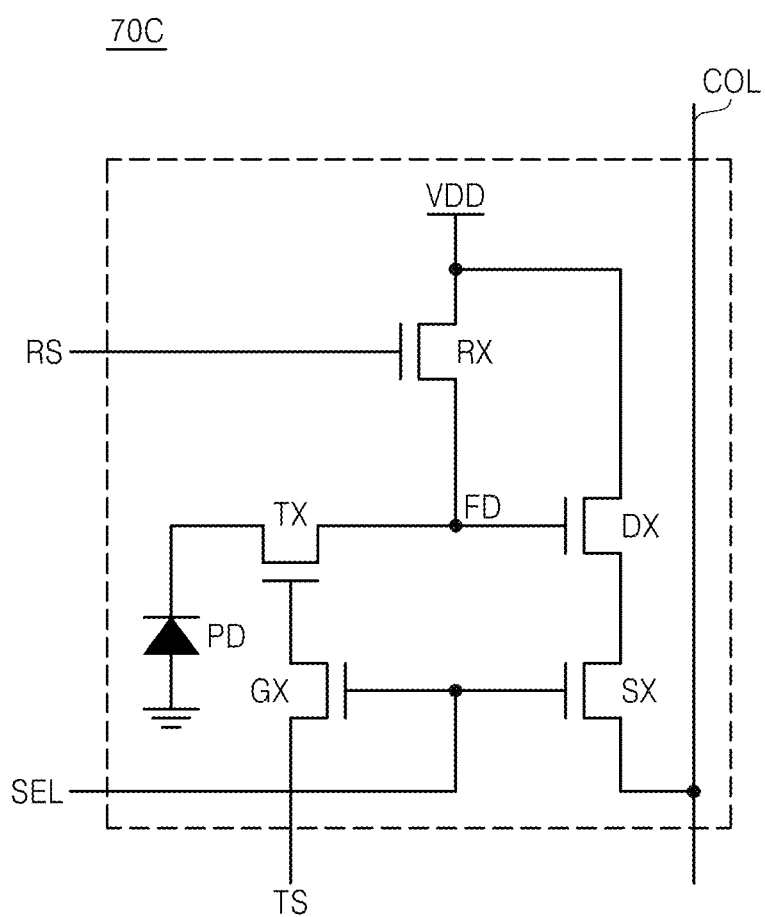
Figure 7D:
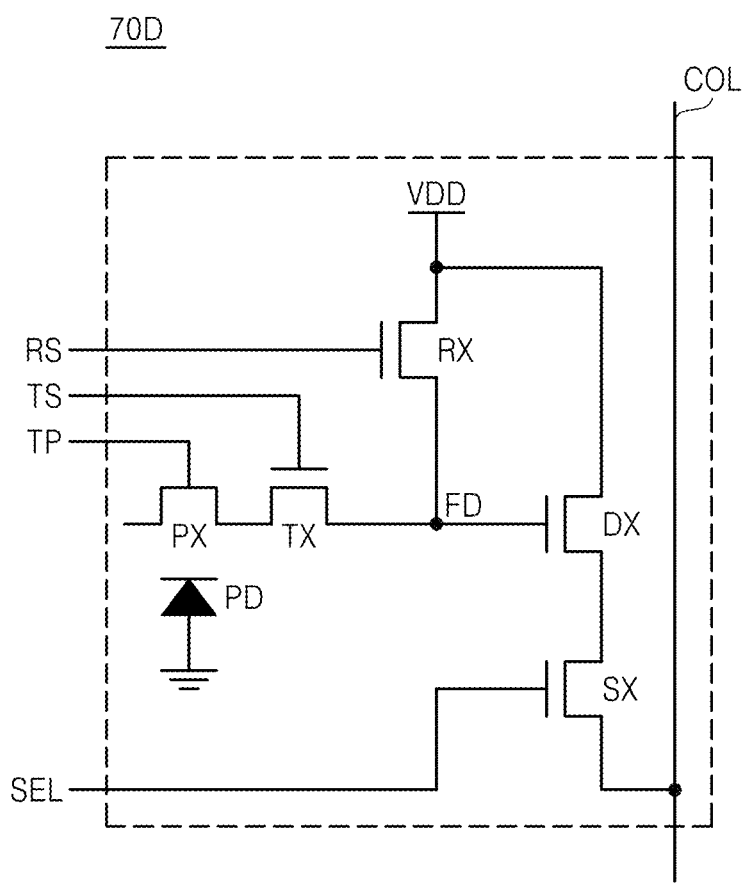

Other examples of a pixel are illustrated in FIGS. 7B through 7D.

Referring to FIG. 7B, a pixel 70B has a 3-transistor (3T) structure that includes the photodiode PD, the reset transistor RX, the drive transistor DX, and the select transistor SX.

Referring to FIG. 7C, a pixel 70C has a 5-transistor (5T) structure that includes the photodiode PD, the reset transistor RX, the drive transistor DX, the select transistor SX, the transfer transistor TX, and a transistor GX. The transistor GX may transmit the transfer control signal TS to the transfer transistor TX in response to the select signal SEL.

Referring to FIG. 7D, a pixel 70D has a 5T structure that includes the photodiode PD, the transfer transistor TX, the reset transistor RX, the drive transistor DX, the select transistor SX, and a transistor PX. The transistor PX operates in response to a control signal TP. An output signal of each of the pixels 70A through 70D is output through a column line COL.

Figure 8:
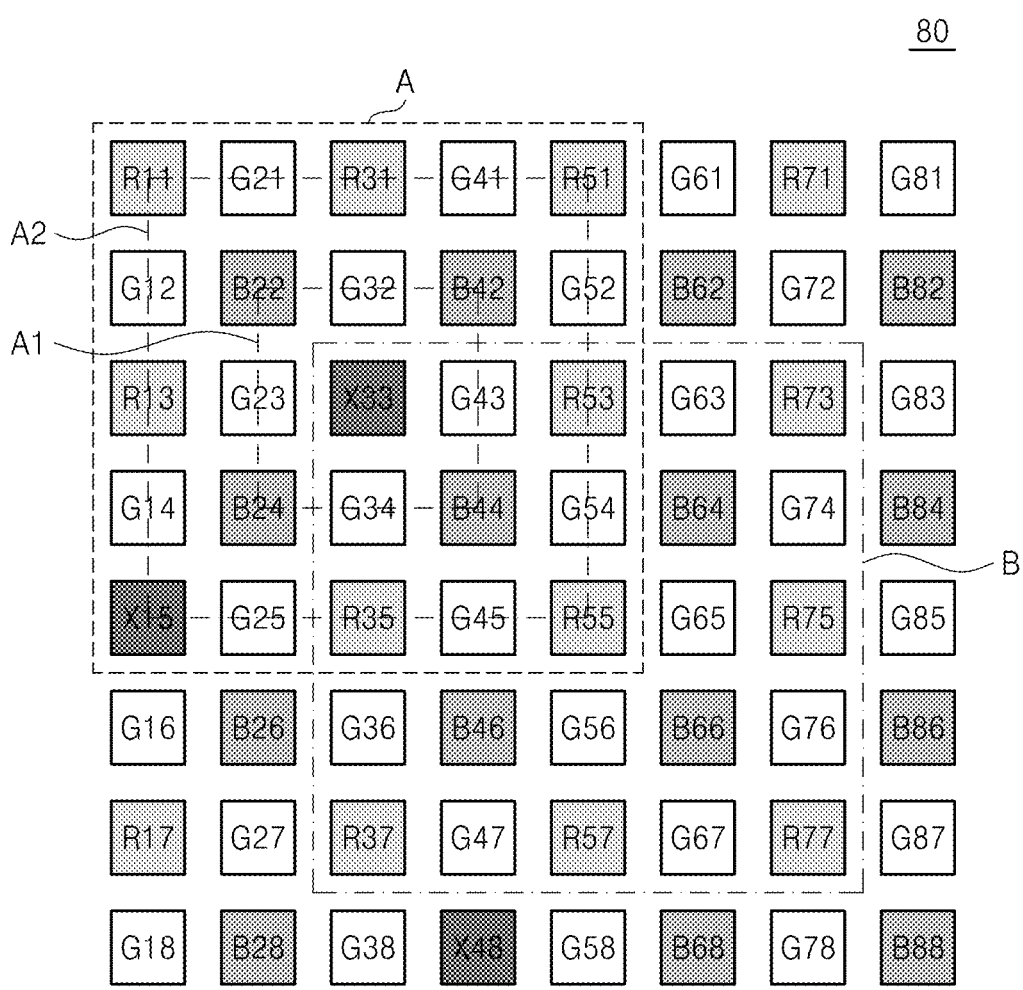
FIG. 8 is a diagram for explaining interpolation in an active pixel block according to some embodiments of the exemplary embodiments.

FIG. 8 is a diagram for explaining interpolation in an active pixel block 80 according to some embodiments of the exemplary embodiments. Here, interpolation using a 5*5 pixel block will be described. Referring to FIG. 8, the active pixel block 80 is included in a pixel array of an image sensor. Although not shown, the pixel array also includes a column OB pixel block and a frame OB pixel block.

The active pixel block 80 is assumed to have an 8*8 array structure, including pixels R11 through B88. A unit pixel pattern of the active pixel block 80 may be a mosaic Bayer pattern. The Bayer pattern includes two G pixels, one R pixel, and one B pixel. The unit pixel pattern is repeatedly arranged in the active pixel block 80.

Since there is no data about the dark pixel X33, interpolation needs to be performed on the dark pixel X33. For the interpolation, a 5*5 block A is set around the dark pixel X33. At this time, eight pixels adjacent to the dark pixel X33 are set into a small block A1, and sixteen peripheral pixels are set into a large block A2.

Since the block A1 is more adjacent to the dark pixel X33 than the block A2, greater weight is given to the block A1 and less weight is given to the block A2. Through this process, RGB color correction is carried out on the dark pixel X33. The dark pixel X15 in the block A2 may be excluded from the interpolation.

However, when the interpolation on the dark pixel X33 is performed prior to interpolation on the dark pixel X15, the interpolated RGB value for the dark pixel X33 may be used during the interpolation on the dark pixel X15. In addition, G color interpolation and B color interpolation with respect to the active pixel R55 may be performed in a same manner as described above, using output signals of a block B.

Figure 9:
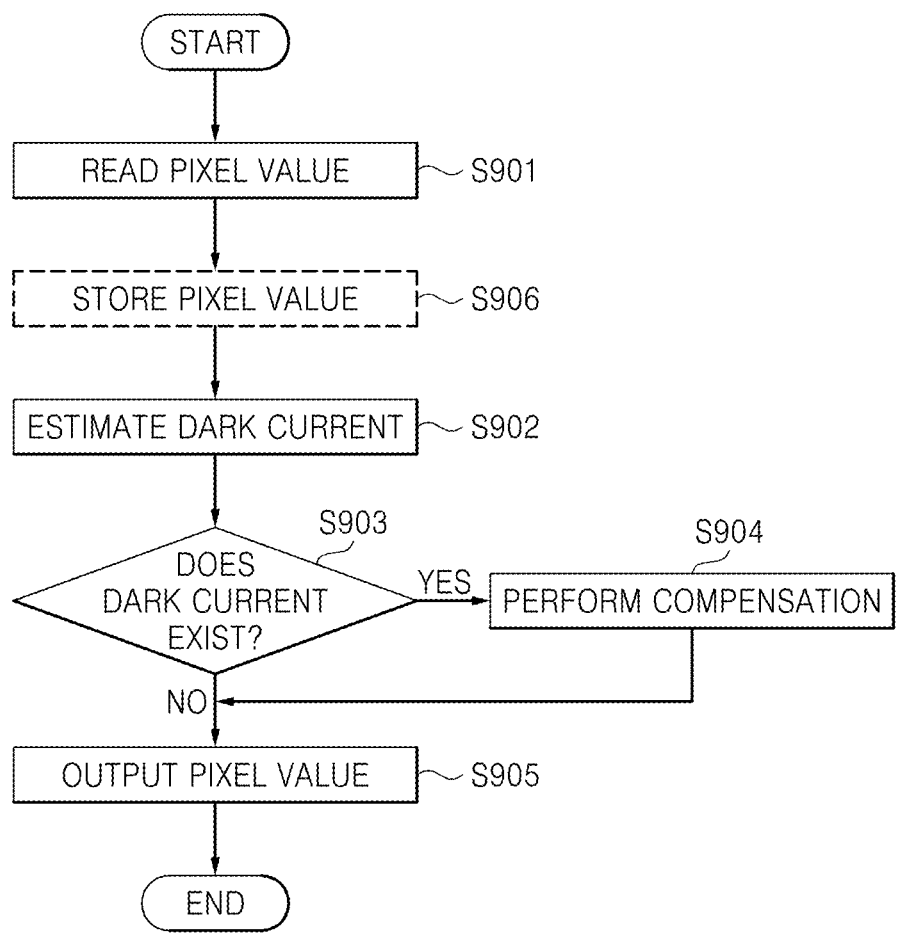
FIG. 9 is a flowchart of a method of compensating for a local dark current according to some embodiments of the exemplary embodiments.

FIG. 9 is a flowchart of a method of compensating for a local dark current according to some embodiments of the exemplary embodiments. Referring to FIG. 9 and operation S901, data is read from an active pixel block, including an active pixel and a dark pixel. In operation S906, the data is output as a digital value through CDS and/or analog-to-digital conversion and the digital value is stored in a memory. At this time, the memory may be divided to store active pixel data and dark pixel data separately.

In operation S902, the compensation circuit 36 estimates a local dark current using a calculated value for the position of the dark pixel or an address of the dark pixel stored in advance. In operation S903, the compensation circuit 36 determines the existence or non-existence of local dark current. In operation S904, when the local dark current exists, the compensation circuit 36 performs compensation of the local dark current on the active pixel. In operation S905, the compensation circuit 36 outputs the compensated data.

Figure 10:
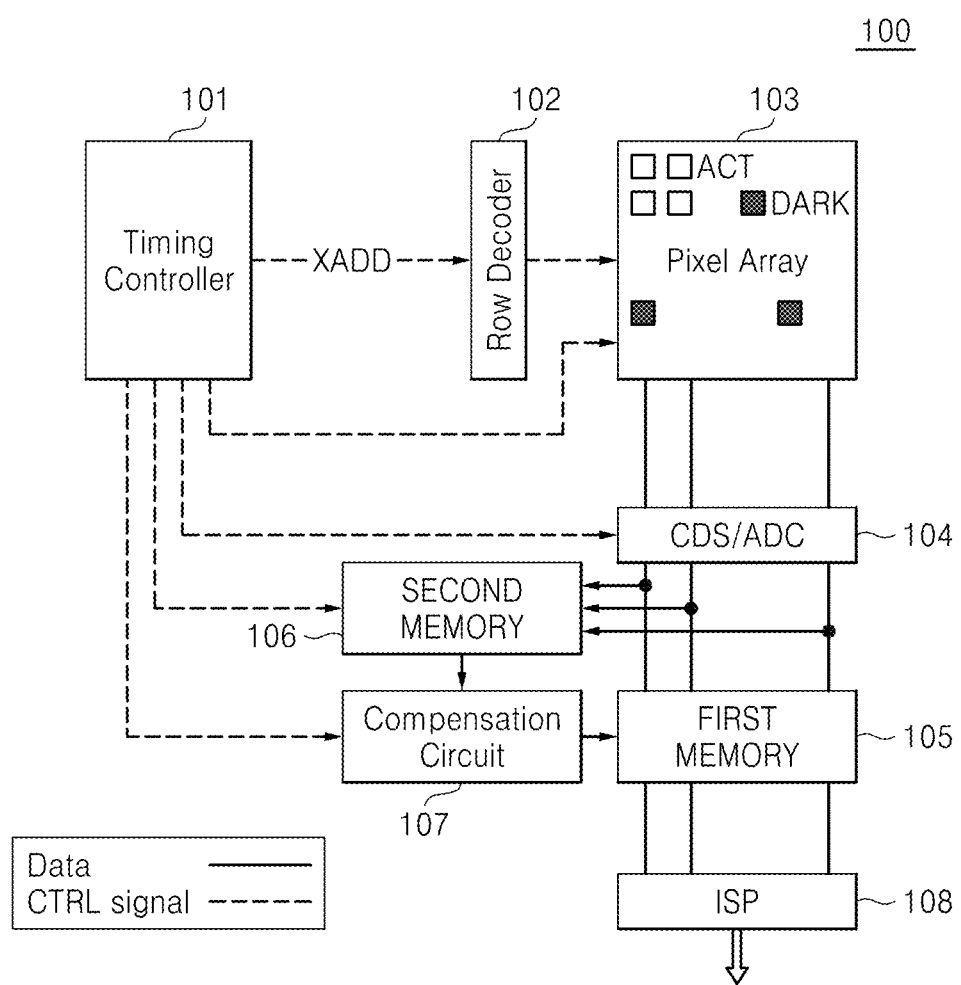
FIG. 10 is a diagram of an image sensor according to other embodiments of the exemplary embodiments.

FIG. 10 is a diagram of an image sensor 100 according to other embodiments of the exemplary embodiments. Referring to FIG. 10, the image sensor 100 converts an optical signal into an electrical signal. A timing controller 101 controls the operation timing of the image sensor 100. The timing controller 101 may control integration time of the image sensor 100 using a transfer control signal.

The image sensor 100 includes a pixel array 103, a CDS/ADC 104, a row address decoder 102, a first memory 105, a second memory 106, a dark shading compensation circuit 107, and an image signal processor (ISP) 108. The pixel array 103 includes the structure and the operations described with reference to FIGS. 1 through 9, and includes active pixels ACT and dark pixels DARK in an active pixel block.

The CDS/ADC 104 performs CDS and/or analog-to-digital conversion on an analog signal output from each of the active pixels ACT and the dark pixels DARK, in the pixel array 103.

The structures and the operations of the first memory 105, the second memory 106, and the compensation circuit 107 illustrated in FIG. 10 are similar to those of the first memory 34, the second memory 35, and the compensation circuit 36 described with reference to FIGS. 3 through 4C.

The ISP 108 performs signal processing using a digital image signal on which local dark current compensation has been performed. The signal processing may include color interpolation, color correction, auto white balance, gamma correction, color saturation correction, formatting, bad pixel correction, and/or hue correction.

The row address decoder 102 controls the operation (or output) timing of each row in the pixel array 103 using address information XADD provided from the timing controller 101.

FIG. 11 is a block diagram of a camera system 110 according to some embodiments of the exemplary embodiments. The camera system 110 may include a digital camera, a smart phone including a digital camera, or a tablet personal computer (PC) including a digital camera.

Referring to FIG. 11, the camera system 110 may include a lens 111, an image sensor 112, a motor unit 113, and an engine unit 114. A pixel array and the image sensor 112 including the pixel array may include the structures and operations for local dark current compensation, described with reference to FIGS. 1 through 10.

The lens 111 focuses incident light onto a light receiving area (e.g., a photodiode) in the image sensor 112. The image sensor 112 generates image data based on the incident light received through the lens 111. The image sensor 112 may provide the image data to the engine unit 114 based on a clock signal CLK. The image sensor 112 may interface with the engine unit 114 using a mobile industry processor interface (MIPI®), and/or a camera serial interface (CSI).

The motor unit 113 may adjust the focus of the lens 111 in response to a control signal CTRL received from the engine unit 114, or perform shuttering. The engine unit 114 controls the image sensor 112 and the motor unit 113. The engine unit 114 may generate YUV data, including a distance to an object, a luminance component, a difference between the luminance component and a blue component, and a difference between the luminance component and a red component or compressed data, e.g., Joint Photography Experts Group (JPEG) data, based on distance data and/or image data received from the image sensor 112.

The engine unit 114 may be connected to a host/application 115 and may provide the YUV data or JPEG data to the host/application 115 based on a master clock signal MCLK. In addition, the engine unit 114 may interface with the host/application 115 using a serial peripheral interface (SPI) and/or an inter integrated circuit (I²C).

Figure 12:
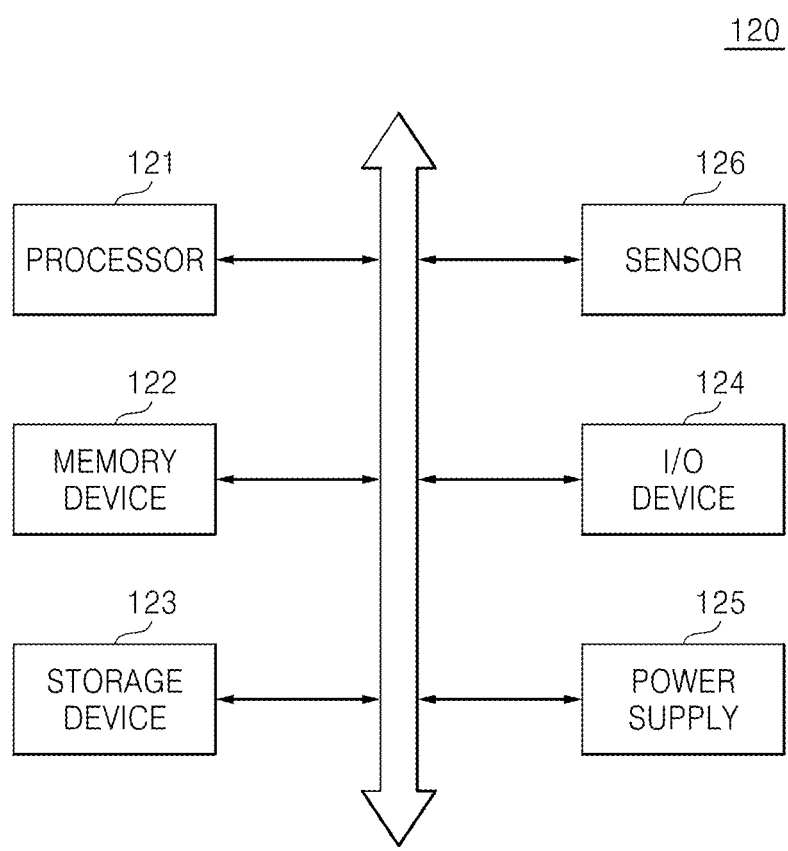
FIG. 12 is a block diagram of a computing system according to some embodiments of the exemplary embodiments.

FIG. 12 is a block diagram of a computing system 120 according to some embodiments of the exemplary embodiments. Referring to FIG. 12, the computing system 120 may include a processor 121, a memory device 122, a storage device 123, an input/output (I/O) device 124, a power supply 125, and an image sensor 126. The image sensor 126 may include the structures and operations described with reference to FIGS. 1 through 10. Although not shown in FIG. 12, the computing system 120 may also include ports that can communicate with video cards, sound cards, memory cards, universal serial bus (USB) devices, or other electronic devices.

The processor 121 may perform particular calculations or tasks. The processor 121 may include a microprocessor or a central processing unit (CPU). The processor 121 may communicate with the memory device 122, the storage device 123, and the I/O device 124 through an address bus, a control bus, and a data bus.

The processor 121 may also be connected to an extended bus, such as a peripheral component interconnect (PCI) bus. The memory device 122 may store data necessary for the operations of the computing system 120. The memory device 122 may be implemented by dynamic random access memory (DRAM), mobile DRAM, static RAM (SRAM), phase-change RAM (PRAM), ferroelectric RAM (FRAM), resistive RAM (RRAM) and/or magnetoresistive RAM (MRAM).

The storage device 123 may include a solid state drive (SSD), a hard disk drive (HDD), and/or a compact disk-read only memory (CD-ROM). The I/O device 124 may include an input device such as a keyboard, a keypad, or a mouse, and an output device such as a printer or a display. The power supply 125 may provide an operating voltage necessary for the operation of the computing system 120.

The image sensor 126 may communicate with the processor 121 through buses or other communication links. The image sensor 126 and the processor 121 may be integrated together into a single chip or may be separately integrated into different chips, respectively. The computing system 120 may be any type of computing system using the image sensor 126. For instance, the computing system 120 may include a digital camera, a cellular phone, a personal digital assistant (PDA), a portable multimedia player (PMP), a smart phone, or a tablet PC.

Figure 13:
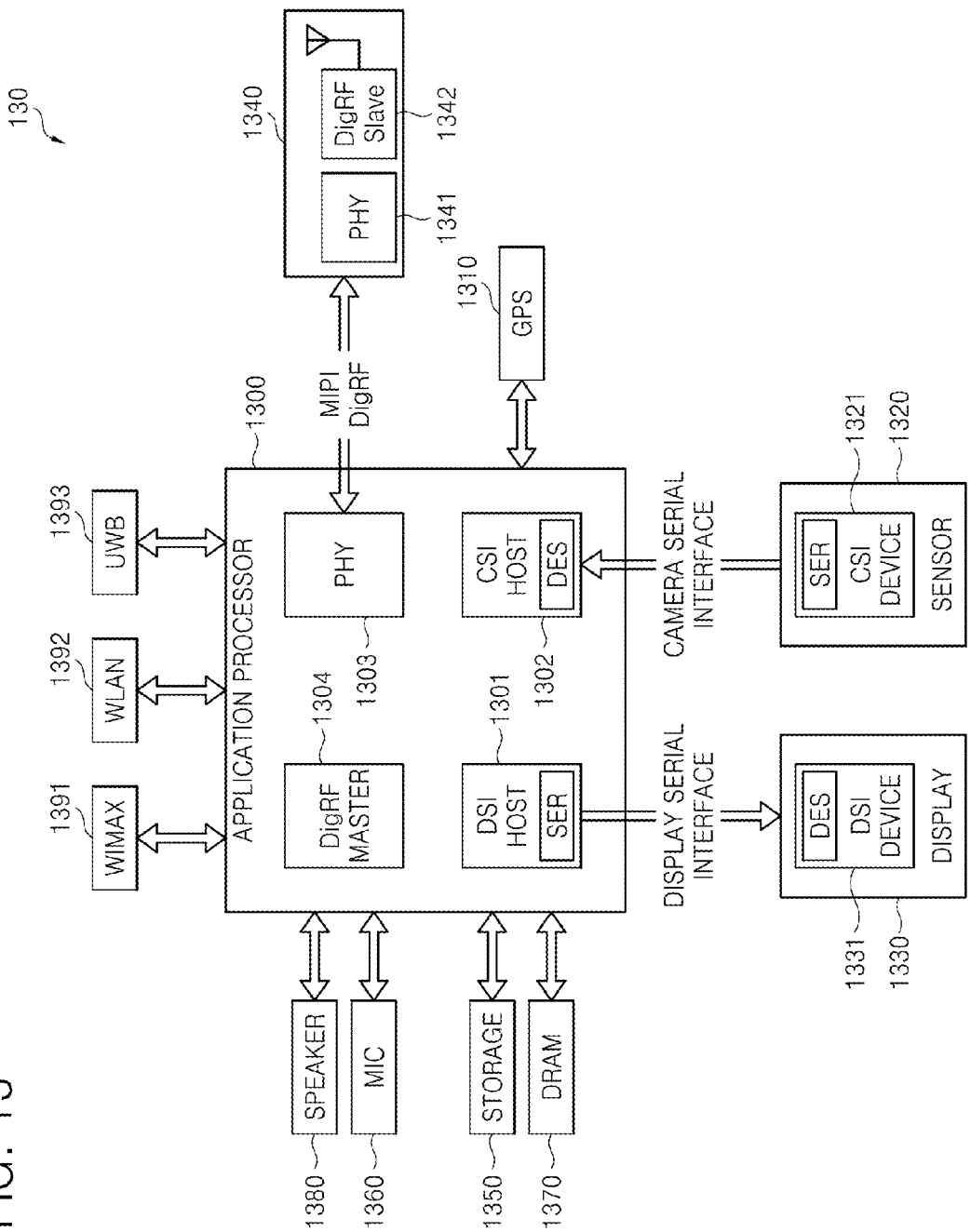
FIG. 13 is a block diagram of an interface used in the computing system illustrated in FIG. 12 according to some embodiments of the exemplary embodiments.

FIG. 13 is a block diagram of a computing system 130 according to some embodiments of the exemplary embodiments. Referring to FIG. 13, the computing system 130 may be implemented as a data processing device that can use or support MIPI®. The computing system 130 may include an application processor 1300, an image sensor 1320, and a display 1330.

A camera serial interface (CSI) host 1302 included in the application processor 1300 may perform serial communication with a CSI device 1321 included in the image sensor 1320 through CSI. The CSI host 1302 may include a deserializer DES, and the CSI device 1321 may include a serializer SER. The image sensor 1320 may include the structures and operations described with reference to FIGS. 1 through 10.

A display serial interface (DSI) host 1301 included in the application processor 1300 may perform serial communication with a DSI device 1331 included in the display 1330 through DSI. The DSI host 1301 may include a serializer SER, and the DSI device 1331 may include a deserializer DES.

The computing system 130 may also include a radio frequency (RF) chip 1340 communicating with the application processor 1300. A physical layer (PHY) 1303 of the application processor 1300 and a PHY 1341 of the RF chip 1340 may communicate data with each other according to MIPI DigRF. The application processor 1300 may also include a DigRF master 1304 that controls data communication of the PHY 1303 using MIPI DigRF.

The computing system 130 may further include a global positioning system (GPS) receiver 1310, a storage 1350, a microphone (MIC) 1360, a DRAM 1370, and a speaker 1380. The computing system 130 may communicate using an ultra-wideband (UWB) 1393, a wireless local area network (WLAN) 1392, and a worldwide interoperability for microwave access (Wimax) 1391. The structure and interface of the computing system 130 illustrated in FIG. 13 is just an example, and the exemplary embodiments are not restricted to this example.

Figure 14:
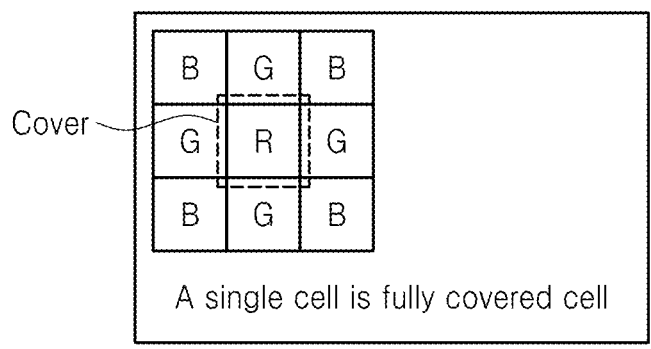
FIG. 14 is a diagram for explaining cover shapes according to some embodiments of the exemplary embodiments.
Figure 14:
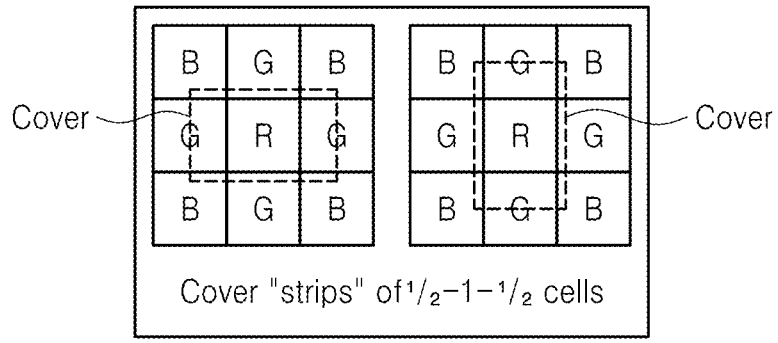
Figure 14:
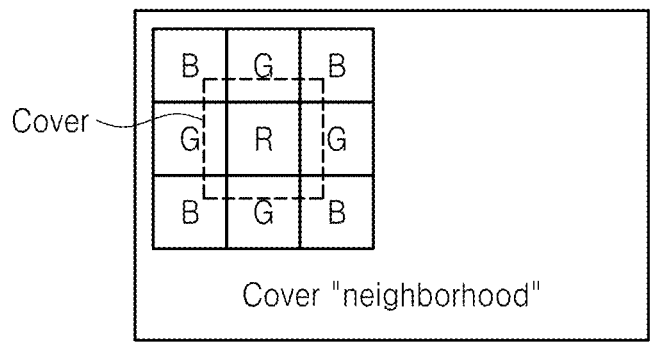

FIG. 14 is a diagram for explaining cover shapes according to some embodiments of the exemplary embodiments. Referring to FIG. 14, some of the pixels of the pixel array are covered to measure a dark signal. Covers can be placed pseudo randomly to avoid artificial frequencies. Further, different embodiments are shown in FIG. 14 to illustrate cover shapes. For example, different cover shapes can be used to better shield light and/or incorporate phase detection autofocus pixels using the cover shapes. In FIG. 14, a first case may cover a single pixel. More advanced covers will cover parts of adjacent pixels, supply better shielding from light and allow phase detection auto focus. Covering more areas will give better shielding, but may reduce image quality. In FIG. 14, a second case may cover stripes of 0.5-1.5 cells. In FIG. 14, a third case may cover a neighborhood of pixels.

Figure 15:
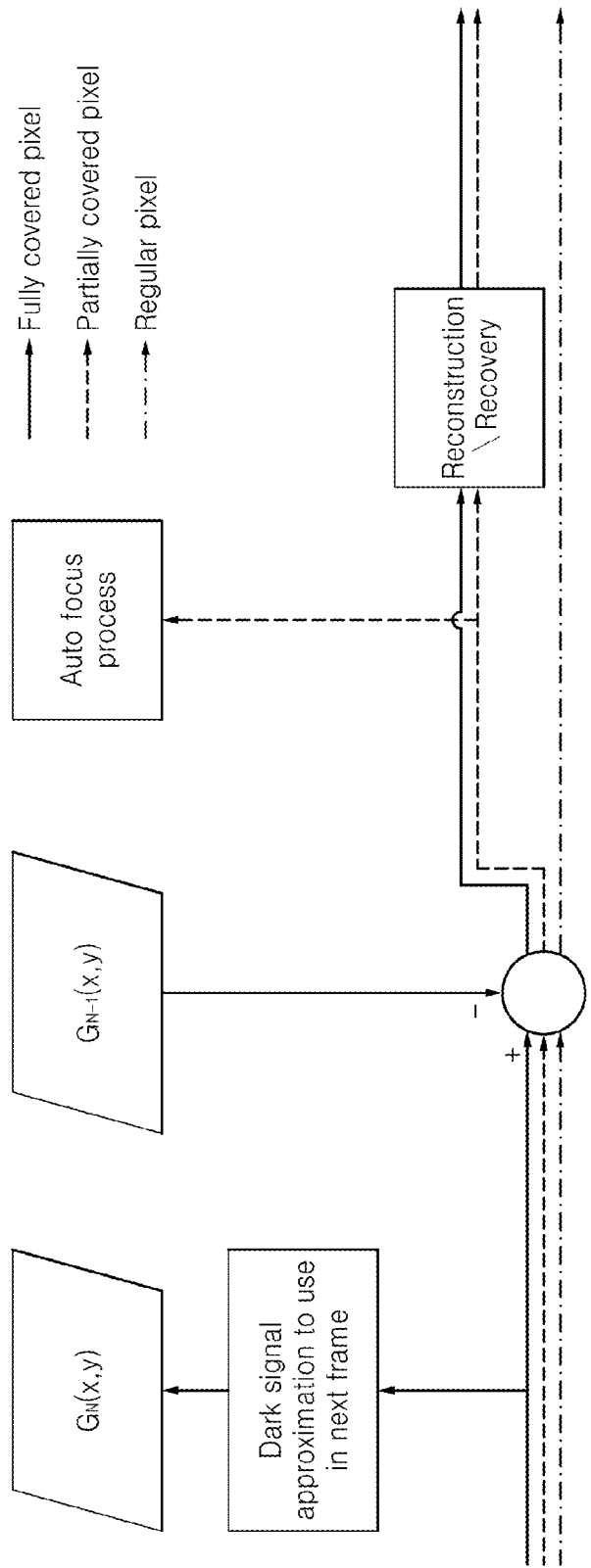
FIG. 15 is a flowchart of dark signal approximation and compensation according to some embodiments of the exemplary embodiments.

FIG. 15 is a flowchart of dark signal approximation and compensation according to some embodiments of the exemplary embodiments. Referring to FIG. 15, the flowchart of the dark signal approximation and compensation is based on previous frames and pixel value reconstruction (process frame N). Compensating frame N based on previous frames may cause less time accuracy, but allows for an approximation using data all around the sensor. In other words, frame N is fixed using data gathered only at previous frames.

Figure 16:
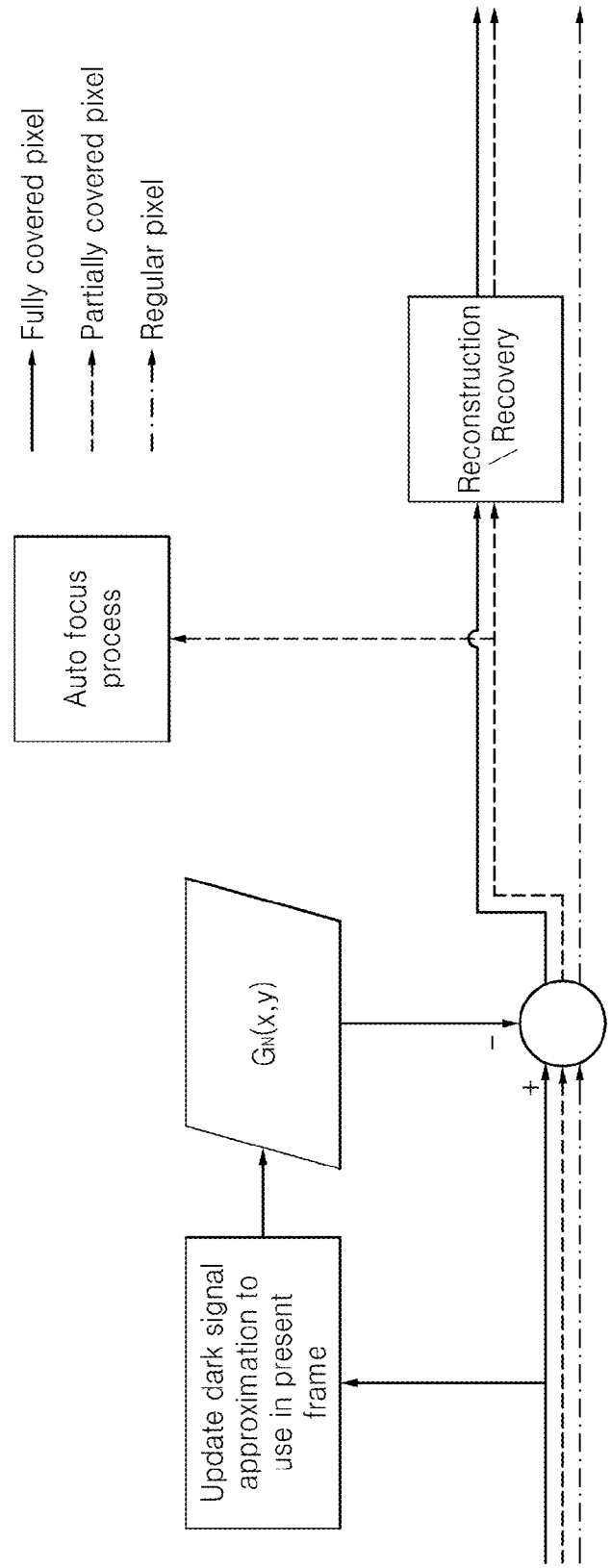
FIG. 16 is a flowchart of dark signal approximation and compensation according to some embodiments of the exemplary embodiments.

FIG. 16 is a flowchart of dark signal approximation and compensation according to some embodiments of the exemplary embodiments. Referring to FIG. 16, the flowchart of the dark signal approximation and compensation is based on a present frame and pixel value reconstruction (process frame N). Compensating frame N based on frame N allows more time accuracy, but may also complicate approximation using data from all around the sensor. Further, the dark signal approximation and compensation in FIG. 16 is more prone to noise. In other words, frame N is fixed by incorporating data of the same frame (which could be merged with prior knowledge).

In FIGS. 14-16 of the embodiments, covered pixels are embedded between normal pixels. Covers can be pseudo randomly placed in order to avoid artificial frequencies. Dark signal approximation and pixel recovery/reconstruction is described in FIGS. 15-16 of the embodiments. Further, a single cover can be used for dark pixels measurement and phase detection auto focus.

As described above, according to some embodiments of the exemplary embodiments, a CMOS image sensor improves dark shading. In addition, the CMOS image sensor performs compensation of both global dark current and local dark current, thereby increasing the picture quality of an image.

What is claimed is:

1. A pixel array of an image sensor comprising:
   an active pixel block which includes a plurality of active pixels, arranged in rows and columns and configured to output an electrical signal corresponding to an optical signal, and at least one dark pixel configured to generate a local dark current, the local dark current indicating a dark current generated based on a locally different property of a pixel; and
   an optical black (OB) pixel block which is arranged around the active pixel block and is configured to generate a global dark current,
   wherein the OB pixel block includes at least one column OB pixel block, arranged corresponding to the columns of the active pixels and configured to generate a global dark current existing between the columns of the active pixels, and at least one frame OB pixel block, arranged corresponding to the rows of the active pixels and configured to generate a global dark current existing between frames, the global dark current indicating a dark current generated by entire active pixels of the active pixel block, and
   wherein the at least one dark pixel comprises at least one fully covered pixel, and at least one partially covered pixel that is positioned adjacent to the at least one fully covered pixel.

2. The pixel array of claim 1, wherein the active pixel block comprises a plurality of unit pixel blocks that have a same pixel arrangement, and each of the unit pixel blocks includes at least one of the active pixels and the at least one dark pixel.

3. The pixel array of claim 1, wherein the active pixel block comprises a plurality of unit pixel blocks that have different pixel arrangements, and each of the unit pixel blocks includes at least two of the active pixels and the at least one dark pixel.

4. The pixel array of claim 1, wherein the at least one dark pixel does not comprise a photodiode.

5. The pixel array of claim 1, wherein the at least one dark pixel does not perform photoelectric conversion in response to the optical signal, when generating the local dark current.

6. The pixel array of claim 1, wherein the at least one dark pixel does not output the electrical signal in response to the optical signal, when generating the local dark current.

7. The pixel array of claim 1, wherein the at least one partially covered pixel includes a phase detection auto focus pixel.

8. An image sensor comprising:
   a pixel array which includes an active pixel block comprising a plurality of active pixels configured to output an electrical signal corresponding to an optical signal, and at least one dark pixel configured to generate a local dark current, the local dark current indicating a dark current generated based on a locally different property of a pixel, and an optical black (OB) pixel block which is arranged around the active pixel block and is configured to generate a global dark current, the global dark current indicating a dark current generated by entire active pixels of the active pixel block; and
   a compensation circuit which is configured to compensate for the global dark current in the active pixels using the global dark current provided from the OB pixel block, and to compensate for the local dark current in each of the active pixels using the local dark current provided from the at least one dark pixel,
   wherein the compensation circuit compensates for the global dark current by equally increasing or decreasing levels of voltages detected in the active pixels by using a level of the global dark current,
   wherein the at least one dark pixel comprises a light blocking layer formed between a photodiode and a microlens, and
   wherein the at least one dark pixel comprises at least one fully covered pixel, and at least one partially covered pixel that is positioned adjacent to the at least one fully covered pixel.

9. The image sensor of claim 8, wherein the compensation circuit comprises:
   a dark pixel marker which is configured to provide position information of the at least one dark pixel from an image signal comprising the electrical signal output from each of the active pixels and the local dark current output from the at least one dark pixel; and a dark shading compensation unit which is configured to compensate for the local dark current in each of the active pixels using the local dark current output from the at least one dark pixel and the position information of the dark pixel.

10. The image sensor of claim 9, wherein the at least one dark pixel comprises a plurality of dark pixels, and wherein the dark shading compensation unit is configured to estimate the local dark current of the at least one active pixel by interpolating the local dark current of the at least one active pixel based on dark current levels of at least two adjacent dark pixels, and compensate for the local dark current in the at least one active pixel using the estimated local dark current.

11. The image sensor of claim 8, wherein the active pixel block comprises a plurality of unit pixel blocks that have a same pixel arrangement, and each of the unit pixel blocks includes at least one of the active pixels and the at least one dark pixel.

12. The image sensor of claim 8, wherein the active pixel block comprises a plurality of unit pixel blocks that have different pixel arrangements, and each of the unit pixel blocks includes at least two of the active pixels and the at least one dark pixel.

13. The image sensor of claim 12, wherein a number of the at least two active pixels is different from a number of the at least one dark pixel.

14. The image sensor of claim 8, wherein the at least one dark pixel is randomly placed among the active pixels.

15. The image sensor of claim 8, wherein the at least one dark pixel does not comprise a photodiode.

16. The image sensor of claim 8, wherein the at least one dark pixel does not output the electrical signal in response to the optical signal, when generating the local dark current.

17. The image sensor of claim 8, further comprising a bad pixel compensation circuit which is configured to perform bad pixel compensation on an output of each of the active pixels in which the local dark current has been compensated.

18. The pixel array of claim 8, wherein the at least one partially covered pixel includes a phase detection auto focus pixel.

19. A method of compensating for a global dark current and a local dark current in an image sensor, the method comprising:

generating an electrical signal corresponding to an optical signal using each of a plurality of active pixels included in an active block, simultaneously generating the global dark current using at least one optical black (OB) pixel included in an OB pixel block which is arranged around the active pixel block, the global dark current indicating a dark current generated by entire active pixels of the active pixel block, and simultaneously generating the local dark current using at least one dark pixel included in the active pixel block, the local dark current indicating a dark current generated based on a locally different property of a pixel;

compensating for the global dark current in the active pixels by equally increasing or decreasing levels of electrical signals generated in the active pixels by using a level of the global dark current; and compensating for the local dark current in each of the active pixels using the local dark current provided from the at least one dark pixel, wherein the at least one dark pixel comprises at least one fully covered pixel, and at least one partially covered pixel that is positioned adjacent to the at least one fully covered pixel.

20. The method of claim 19, wherein the compensating for the local dark current comprises:

providing position information of the at least one dark pixel from an image signal comprising the electrical signal output from each of the active pixels and the local dark current output from the at least one dark pixel; and compensating for the local dark current in each of the active pixels using the local dark current output from the at least one dark pixel and the position information of the at least one dark pixel.

21. The pixel array of claim 19, wherein the at least one partially covered pixel includes a phase detection auto focus pixel.

22. A method of compensating for a global dark current and a local dark current in an image sensor, the method comprising:

reading pixel data from an active pixel block which comprises a plurality of active pixels and at least one dark pixel, reading pixel data from an optical black (OB) pixel block which is arranged around the active pixel block and includes at least one OB pixel;

compensating for the global dark current in the active pixels by equally increasing or decreasing levels of the pixel data read from the active pixel block by using the pixel data read from the OB pixel block, the global dark current indicating a dark current generated by entire active pixels of the active pixel block;

estimating the local dark current of the at least one active pixel using a calculated value for a position of the at least one dark pixel or an address of the at least one dark pixel, the local dark current indicating a dark current generated based on a locally different property of a pixel;

performing compensation of the local dark current on the at least one active pixel using the estimated local dark current when the local dark current exists;

outputting the compensated pixel data;

storing a first pixel data of the pixel data, corresponding to the at least one active pixel, in a first memory; and storing a second pixel data of the pixel data, corresponding to the at least one dark pixel, in a second memory, wherein the first memory is separated from the second memory, and wherein the at least one dark pixel comprises at least one fully covered pixel, and at least one partially covered pixel that is positioned adjacent to the at least one fully covered pixel.

23. The method of claim 22, when if the local dark current does not exist, outputting the pixel data without compensation.

24. The pixel array of claim 22, wherein the at least one partially covered pixel includes a phase detection auto focus pixel.

\* \* \* \* \*